United States Patent
Miyakawa et al.

[11] Patent Number: 6,162,677
[45] Date of Patent: Dec. 19, 2000

[54] SEMICONDUCTOR DEVICE FABRICATING METHOD

[75] Inventors: Yasuhiro Miyakawa; Tsukasa Yajima; Shunji Takase, all of Tokyo, Japan

[73] Assignee: Oki Electric Industry Co., Ltd., Tokyo, Japan

[21] Appl. No.: 09/151,355

[22] Filed: Sep. 10, 1998

[30]     Foreign Application Priority Data

Dec. 22, 1997   [JP]   Japan ..................................... 9-353522

[51] Int. Cl.$^7$ ................................................ H01L 21/8242
[52] U.S. Cl. ........................... 438/253; 254/672; 254/238
[58] Field of Search .................................... 438/238, 239, 438/241, 244, 253, 382, 383, 254, 255, 256, 672, 393, 394, 673, 677, 678; 257/296, 903, 904

[56]              References Cited

U.S. PATENT DOCUMENTS

| | | | |
|---|---|---|---|
| 5,554,557 | 9/1996 | Koh | 437/52 |
| 5,702,968 | 12/1997 | Chen | 437/52 |
| 5,710,078 | 1/1998 | Tseng | 438/620 |
| 5,716,881 | 2/1998 | Liang et al. | 438/238 |
| 5,792,692 | 6/1999 | Li et al. | 438/253 |
| 5,796,135 | 6/1999 | Liang et al. | 257/296 |
| 5,879,986 | 3/1999 | Sung | 438/253 |
| 5,914,510 | 6/1999 | Hieda | 257/301 |
| 6,013,550 | 1/2000 | Lee et al. | 438/253 |
| 6,015,733 | 1/2000 | Lee et al. | 438/253 |
| 6,077,738 | 6/2000 | Lee et al. | 438/241 |
| 6,087,225 | 7/2000 | Bronner et al. | 438/275 |

FOREIGN PATENT DOCUMENTS

| | | |
|---|---|---|
| 1-165162 | 6/1989 | Japan . |
| 1-292863 | 11/1989 | Japan . |
| 4-34971 | 2/1992 | Japan . |

*Primary Examiner*—Charles Bowers
*Assistant Examiner*—Laura Schillinger
*Attorney, Agent, or Firm*—Jones Volentine, L.L.C.

[57]              ABSTRACT

In a semiconductor device fabricating method for fabricating a semiconductor device having a high-density region in which transistors are arranged with a relatively high density, and a low-density region in which transistors are arranged in with a relatively low density, a silicon nitride film of a thickness great enough for the silicon nitride film to serve as a stopper is deposited over the entire surface of the silicon wafer, so that regions between the transfer gates in the high-density region may not be blocked up after removing side walls formed in the entire transistor region. A part of the silicon nitride film in the low-density region, namely, a peripheral circuit region, is removed.

14 Claims, 18 Drawing Sheets

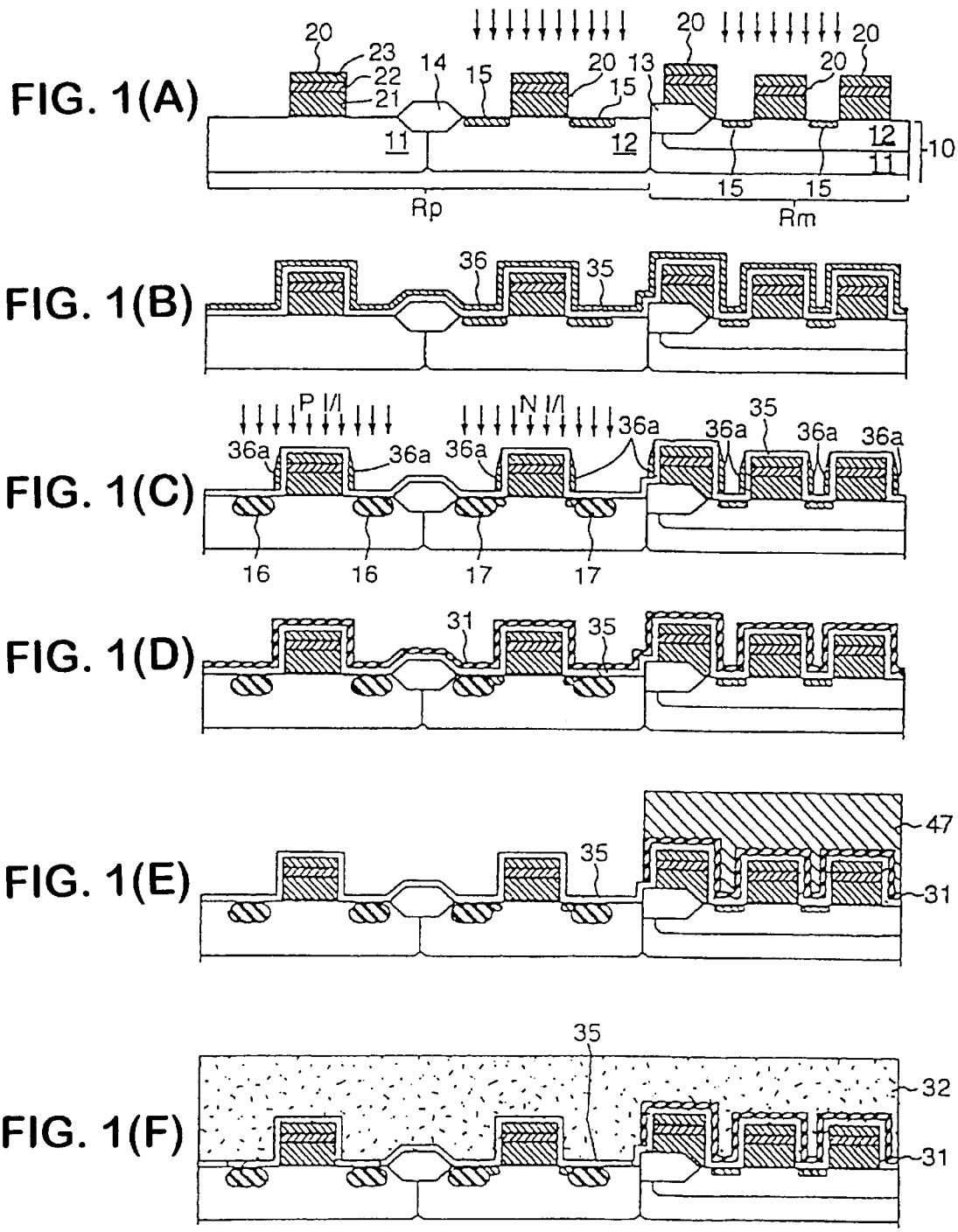

SEMICONDUCTOR DEVICE FABRICATING METHOD

BACKGROUND OF THE INVENTION

1. Field of the Invention

The present invention relates to a semiconductor device fabricating method including a wafer processing process and a wiring process and, more specifically, to contact hole forming techniques.

2. Description of the Related Art

Minimum device dimensions specified by pattern rules have progressively been decreased with the ongoing miniaturization of semiconductor devices, such as LSI circuit devices, and the growth of the number of components per IC chip. The decrease of minimum device dimensions affects the photolithographic process most significantly. The effect of the dislocation of a pattern of components of a semiconductor device, such as a pattern of transfer gates or contact holes, due to errors in pattern alignment in an exposure process relative to the size of the pattern increases with the miniaturization of the pattern, and affects the characteristics of semiconductor device. From the viewpoint of the resolution of photolithography, errors in pattern alignment cannot completely be eliminated. When forming contact holes, it is desired that the contact holes are isolated from adjacent components, such as gates, even if the positions of the contact holes are dislocated relative to the adjacent components.

A prior art semiconductor device fabricating method meeting such a demand will be described with reference to FIGS. 16 to 18. FIGS. 16(A) to 16(D) are enlarged typical sectional views illustrating a workpiece in substrate processing steps of a method of fabricating a DRAM (dynamic random-access memory), and FIGS. 17(A), 17(B), and 18(A) to 18(C) are enlarged typical sectional views illustrating the workpiece in wiring pattern forming steps of the same method. Generally, the DRAM is basically a CMOS circuit formed by connecting n-channel MOSFETs and p-channel MOSFETs by wiring lines.

Referring to FIG. 16(A), n-type regions (n-type wells) 11 and p-type regions (p-type wells) 12 are formed in a surface of a silicon wafer 10 by ion implantation, and element isolation regions 13 and 14 are formed by selective oxidation. A plurality of transfer gates 20 are formed on the silicon wafer 10. The transfer gates 20 are formed by forming a gate oxide film 21, a gate polysilicon film 22 and a silicon dioxide film 23 in that order on the surface of the silicon wafer 10. In this specification, the silicon dioxide film 23 as a component of the transfer gate 20 will be called an "offset silicon dioxide film" because the silicon dioxide film 23 displaces (offsets) the upper surface of the transfer gate 20 relative to the gate polysilicon film 22 serving as an actual conductive layer.

The gate oxide film 21, the gate polysilicon film 22 and the offset silicon dioxide film 23 are formed over the entire surface of the silicon wafer 10. A resist film is formed over the silicon dioxide film 23, the resist film is etched in a pattern corresponding to the transfer gates 20 by an ordinary photolithographic process, the offset silicon dioxide film 23 is etched by a dry etching process using the gate polysilicon film 22 as a stopper. Then, the resist film is removed by ashing, and the gate polysilicon film 22 is etched by a dry etching process using the offset silicon dioxide film 23 as a mask to form the transfer gates 20.

The offset silicon dioxide film 23 is used as a mask to avoid the chipping of a thin resist film when forming a thick transfer gates 20 by etching a thick layer by an etching process using the thin resist film. The thickness of a resist film which can be developed by exposing the same to light on an aligner is dependent on the depth of focus of the aligner. When forming a minute pattern by photolithography, an aligner having a large numerical aperture (N.A.) must be used to secure a high resolution. The depth of focus decreases when the numerical aperture increases. Thus the thickness of the resist film which can be developed decreases as the minuteness of the pattern of the resist film increases. Therefore, a mask like the offset silicon dioxide film 23 is necessary for etching a thick film to form high steps.

A region on the left side, as viewed in FIG. 16, of the element isolation region 13 is a peripheral circuit region Rp in which transistors are arranged in a relatively low density, and a region on the right side, as viewed in FIG. 16, of the element isolation region 13 is a memory cell region Rm in which transistors are arranged in a relatively high density. The p-type wells 12 in both the regions are masked with a resist film and an n-type impurity is injected into the p-type wells 12 as indicated by the arrows by an ion implantation process to form n-type diffused layers 15 which serve as source/drain regions of n-channel MOS transistors. A resist pattern for the ion implantation process is not shown.

Then, a silicon dioxide film is deposited over the entire surface of the wafer by a chemical vapor deposition (CVD) process, the silicon dioxide film is etched by an anisotropic etching process to form side walls 30 on the side surfaces of the transfer gates 20 as shown in FIG. 16(B). The side walls 30 are formed in a width necessary for the side walls 30 to serve as a mask when forming diffused layers which serve as the source/drain regions of the MOS transistors of the peripheral circuit region Rp.

Subsequently, as shown in FIG. 16(C), a mask is formed by an ordinary photolithographic process so as to cover regions other than the p-type well and the n-type well of the peripheral circuit region Rp, and the p-type well of the peripheral circuit region Rp is doped with an n-type impurity and the n-type well of the peripheral circuit region Rp is doped with a p-type impurity by an ion implanting process to form $p^+$-type diffused layers 16 and $n^+$-type diffused layers 17 as the source/drain regions of the MOS transistors of the peripheral circuit region Rp. The MOS transistors of the memory cell region Rm perform merely an ON/OFF operation so that $p^+$-type diffused layers and $n^+$-type diffused layers need not be formed in the memory cell region Rm. The MOS transistors of the peripheral circuit region Rp needs the $p^+$-type diffused layers 16 and the $n^+$-type diffused layers 17 for an amplifying operation. The side walls 30 determine the positions of regions to be subjected to the ion implantation process, i.e., determine the positional relation between the diffused layers 16 and 17, and the transfer gate 20, which determines the characteristics of the MOSFETs. The resist pattern for the ion implantation process is not shown in FIG. 16(C).

After the diffused layers 16 and 17 have been formed in the peripheral circuit region Rp, a silicon nitride film 31, which serves as a stopper when forming contact holes by an etching process, is formed over the entire surface of the wafer as shown in FIG. 16(D), a silicon dioxide film 32 (as shown in FIG. 17) is deposited over the silicon nitride film 31, and the surface of the silicon dioxide film 32 is flattened by a chemical mechanical polishing (CMP).

In a wiring process, a resist film is patterned by an ordinary photolithographic process to form a mask 40 as shown in FIG. 17(A) for forming contact holes reaching the silicon wafer 10 in the memory cell region Rm. The silicon dioxide film 32 is etched by using the mask 40 and using the silicon nitride film 31 as a stopper, and then contact holes 41 reaching the silicon wafer 10 are formed by etching the silicon nitride film 31.

The mask 40 is removed by ashing and a polysilicon film is formed so as to fill up the contact holes 41. The surface of the workpiece is etched back to form pads 50 as shown in FIG. 17(B). The pads 50 are connected to capacitor electrodes which are to be formed later.

After the pads 50 have been formed, a silicon dioxide film 33, i.e., an insulating layer, is deposited as shown in FIG. 18(A), and contact holes are formed to connect bit lines formed on the silicon dioxide film 33 to the silicon wafer 10 in the memory cell region Rm. A resist film formed on the silicon dioxide film 33 is patterned by an ordinary photolithographic process to form a mask 42, the silicon dioxide films 33 and 32 covered with the mask 42 are etched by using the silicon nitride film 31 as a stopper, and then the silicon nitride film 31 is etched to form contact holes 43 reaching the silicon wafer 10.

Since the silicon dioxide film 32 is etched by using the silicon nitride film 31 as a stopper, the contact holes 41 and 43 reaching the silicon wafer 10 can be formed without causing insulation breakdown in the transfer gates 20 even if the openings of the mask for forming the contact holes 41 and 43 are dislocated from their correct positions.

Subsequently, contact holes reaching the gate polysilicon film 22 of the transfer gates 20 formed in the peripheral circuit region Rp are formed. The mask 42 is removed by ashing, a mask 44 having openings reaching the transfer gates 20 as shown in FIG. 18(B) are formed by an ordinary photolithographic process, and the silicon dioxide films 33 and 32, the silicon nitride film 31 and the offset silicon dioxide film 23 are etched to form contact holes 45 reaching the transfer gates 20.

The mask 44 is removed by ashing, a bit line film 34 is formed, a mask 46 of a pattern corresponding to bit lines is formed by an ordinary photolithographic process, and the bit line film 34 is etched by using the mask 46 and using the silicon dioxide film as a stopper to form bit lines as shown in FIG. 18(C). After the bit lines have been formed, capacitor electrodes are formed to accomplish a wafer processing process (preparatory process) for fabricating a DRAM. Then, the workpiece is tested, and the workpiece is subjected to a packaging process (finishing process) to complete a semiconductor device.

In this conventional semiconductor device fabricating method, however, the side walls 30 necessary for forming the diffused layers 16 and 17 of the peripheral circuit region Rp are formed on the side surfaces of the transfer gates 20 of the memory cell region Rm and remain unremoved until the final process. Therefore, regions for the silicon nitride film 31 formed as a stopper between the transfer gates 20 are relatively narrow, which is an impediment to the miniaturization of the semiconductor device. If the semiconductor device of the foregoing configuration is miniaturized and the intervals between the transfer gates 20 are reduced, regions between the side walls 30 are covered with the silicon nitride film 31, which makes it difficult to form the contact holes 41 and 43 reaching the silicon wafer 10 without causing insulation breakdown in the transfer gates 20; that is, if the contact holes 41 and 43 are formed in the regions between the side walls 30 covered with the silicon nitride film 31 by etching so that the contact holes 41 and 43 may not cause insulation breakdown in the transfer gates 20, it is highly possible that the contact holes 41 and 43 do not reach the silicon wafer 10 and, if etching is performed so that the contact holes 41 and 43 surely reach the silicon wafer 10, it is possible that insulation breakdown is caused in the transfer gates 20 by side etching.

If the conventional semiconductor device fabricating method is applied to fabricating a high-density DRAM having the transfer gates 20 covered with the offset silicon dioxide film 23, the contact holes 43 for connecting the bit lines to the silicon wafer 10, and the contact holes 45 for connecting the bit lines to the transfer gates 20 need to be formed by separate photolithographic processes and etching processes, respectively. Therefore, the conventional semiconductor device fabricating method needs a large number of steps. Since the positions of the contact holes must precisely be determined, the photolithographic process needs a large number of critical layers. Therefore the semiconductor device fabricating method which forms the two sets of contact holes 43 and 45 separately has an increased cost as compared with a semiconductor device fabricating method which forms the two sets of contact holes 43 and 45 simultaneously.

SUMMARY OF THE INVENTION

The present invention has been made in view of the fore going problems in the prior art and it is there fore an object of the present invention to provide a semiconductor device fabricating method using a silicon nitride film formed as a stopper which does not obstruct the miniaturization of a semiconductor device, and capable of simultaneously forming contact holes for connecting wiring lines in an upper layer to a silicon wafer, and contact holes for connecting wiring lines to transfer gates when fabricating a high-density DRAM.

According to one aspect of the present invention, a semiconductor device fabricating method has a first feature which removes side walls formed for use as a mask when doping regions around transfer gates in a low-density region with impurities after a doping process, and second feature which deposits a silicon dioxide film after removing a silicon nitride film formed as a stopper in the low-density region. The first feature enables the formation of silicon nitride film in a relatively wide regions between transfer gates in a high-density region, so that it is possible to prevent the region from being blocked up with the silicon nitride film even if intervals between the transfer gates are reduced due to miniaturization. The second feature enables the simultaneous formation of contact holes for connecting bit lines to a silicon wafer, and contact holes for connecting the bit lines to the transfer gates by etching a silicon nitride film after etching a silicon dioxide film by using the silicon nitride film as a stopper.

More specifically, a semiconductor device fabricating method of the present invention for fabricating a semiconductor device having a high-density region in which transistors are arranged in a relatively high density, and a low-density region in which transistors are arranged in a relatively low density comprises the steps of: forming transfer gates on a silicon wafer; forming a first silicon dioxide film as a protective film over the entire surface of the silicon wafer; depositing a second film different in kind from that of the protective film and having a high (second film)/ (protective film) etch selectivity; forming side walls on the side surfaces of the transfer gates through the anisotropic etching of the second film; doping regions around the transfer gates in the low-density region with impurities by using the side walls as a mask; removing the second film by etching using the protective film as a stopper; forming a silicon nitride film of a thickness great enough for the silicon nitride film to serve as a stopper over the entire surface of the silicon wafer so that regions between the transfer gates in the high-density region may not be blocked up; removing parts of the silicon nitride film corresponding to at least the upper surfaces of the transfer gates to be connected to wiring lines in an upper layer; depositing a second silicon dioxide film of a thickness so as to cover the transfer gates over the entire surface of the silicon wafer; forming a mask for forming contact holes opening to the upper surfaces of the transfer gates to be connected to wiring lines in the low-density region and contact holes opening to the upper surface of the silicon wafer to be connected to wiring lines in the high-density region by a photolithographic process; and forming contact holes by etching the second silicon dioxide film through the mask for forming contact holes by using the silicon nitride film as a stopper and removing the silicon nitride film by etching.

The second film may be a polysilicon film or a silicon nitride film. The transfer gates may include the polysilicon film and a silicon dioxide film formed on the polysilicon film.

In the step of removing the silicon nitride film, the high-density region is masked and the silicon nitride film is etched by isotropic etching to remove the silicon nitride film formed in the low-density region entirely or the silicon nitride film is etched by anisotropic etching to remove the silicon nitride film in the low-density region leaving parts thereof covering the side surfaces of the transfer gates. Only parts of the silicon nitride film corresponding to the upper surfaces of the transfer gates to be connected to bit lines may be removed.

The semiconductor device fabricating method may further comprise the step of forming a silicon dioxide film as a mask for covering the silicon nitride film after the step of forming the silicon nitride film to be used as a stopper. In the step of removing the silicon nitride film, the high-density region is masked, the silicon dioxide film for a mask is etched with a hydrogen fluoride solution, and a part of the silicon nitride film in the low-density region is removed entirely by masking the high-density region, and then etching the silicon nitride film by a hot phosphoric acid solution by using the masking silicon dioxide film remaining in the high-density region.

BRIEF DESCRIPTION OF THE DRAWINGS

FIGS. 1(A) to 1(F) are enlarged typical sectional views of a workpiece in different steps of a wafer processing process included in a semiconductor device fabricating method in a first embodiment according to the present invention;

DESCRIPTION OF THE PREFERRED EMBODIMENTS

Semiconductor device fabricating methods in first, to fifth embodiments according to the present invention will be described with reference to FIGS. 1 to 15 as applied to fabricating a dynamic random-access memory (DRAM).

First Embodiment

Figure 2A:
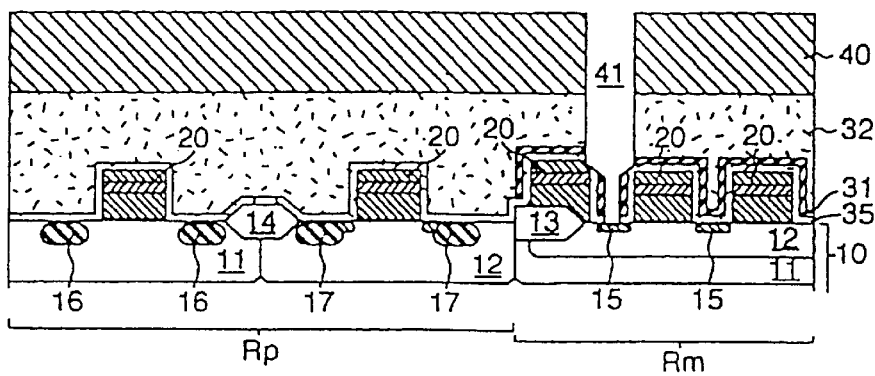
FIGS. 2(A) and 2(B) are enlarged typical sectional views of the workpiece in different steps of a wiring process included in the semiconductor device fabricating method in the first embodiment according to the present invention.
Figure 2B:
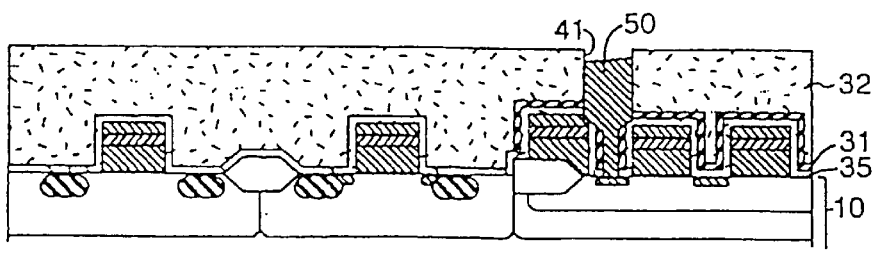
Figure 3A:
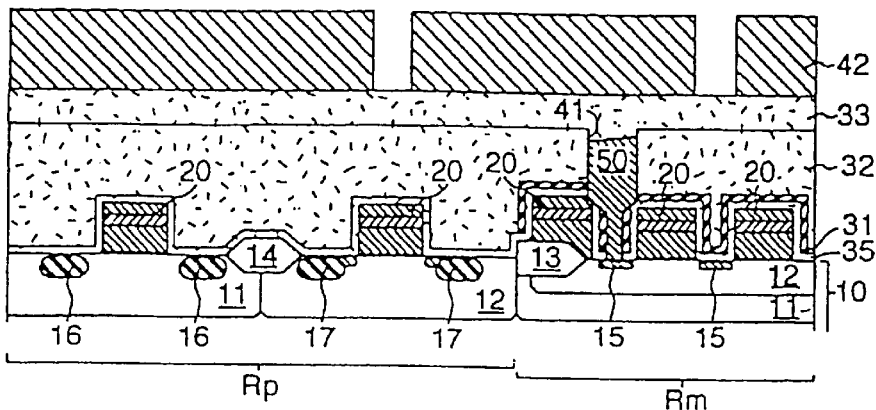
FIGS. 3(A) to 3(C) are enlarged typical sectional views of the workpiece in different steps of the wiring process included in the semiconductor device fabricating method in the first embodiment according to the present invention.
Figure 3B:
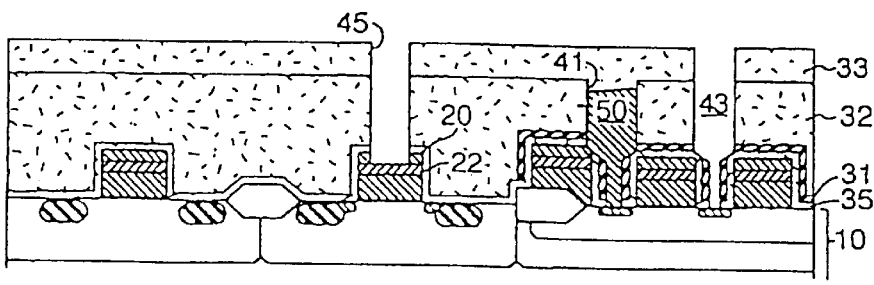
Figure 3C:
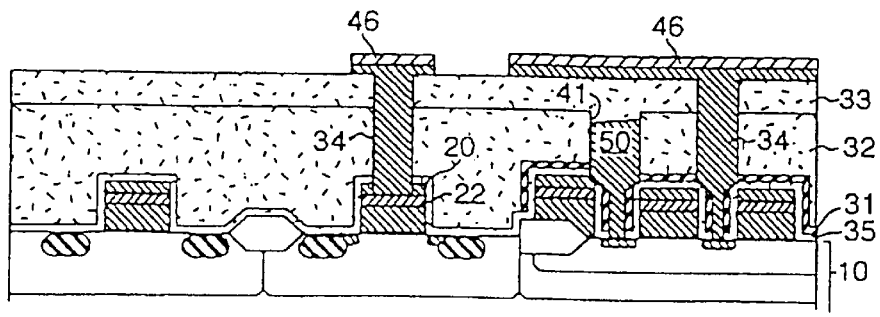

FIGS. 1 to 3 illustrate a semiconductor device fabricating method in a first embodiment according to the present invention as applied to fabricating a DRAM. FIGS. 1(A) to 1(F) show a workpiece in different steps of a wafer processing process included in the semiconductor device fabricating method and FIGS. 2(A), 2(B) and 3(A) to 3(C) show the workpiece in different steps of a wiring process included in the semiconductor device fabricating method. Generally, a DRAM comprises, as basic circuits, CMOS circuits. The CMOS circuit is constructed by interconnecting an n-channel MOSFET (nMOSFET) and a p-channel MOSFET (pMOSFET) by wiring lines. Referring to FIG. 1(A), n-type regions (n-wells) 11 and p-type regions (p-wells) 12 are formed by ion implantation in a silicon wafer 10. Isolation regions 13 and 14 are formed by selective oxidation. A peripheral circuit region Rp, i.e., a low-density region in which transistors are formed in a relatively low density, extends on the left side, as viewed in FIG. 1(A), of the isolation region 13, and a memory cell region Rm, i.e., a high-density region in which transistors are formed in a relatively high density, extends on the right side, as viewed in FIG. 1(A), of the isolation region 13.

The semiconductor device fabricating method comprises a first step (FIG. 1(A)) of forming transfer gates 20 on the silicon wafer 10, a second step (FIG. 1(B)) of forming a silicon dioxide film 35 as a protective film, a third step (FIG. 1(B)) of depositing a polysilicon film 36 on the first silicon dioxide film 35, a fourth step (FIG. 1(C)) of forming side walls 36a on the side surfaces of the transfer gates 20, a fifth step (FIG. 1(C)) of doping regions around the transfer gates 20 in the peripheral circuit region Rp with an n-type and a p-type impurity, a sixth step (FIGS. 1(C) and 1(D)) of removing the polysilicon film 36 by using the first silicon dioxide film 35 as a stopper, a seventh step (FIG. 1(D)) of forming a silicon nitride film 31 as a stopper over the entire surface of the silicon wafer 10, an eighth step (FIG. 1(E)) of removing part of the silicon nitride film 31 in the peripheral circuit region Rp, a ninth step (FIG. 1(F)) of depositing a second silicon dioxide film 32 over the entire surface of the silicon wafer 10 so as to cover the transfer gates 20, a tenth step (FIG. 1(F)) of flattening the surface of the second silicon dioxide film 32, an eleventh step (FIG. 2(A)) of forming contact holes 41 for pads 50 to be connected to capacitor electrodes, a twelfth step (FIG. 2(B)) of forming the pads 50 in the contact holes 41, a thirteenth step (FIG. 3(A)) of forming a mask 42 for forming contact holes for pads to be connected to wiring lines in an upper layer, a fourteenth step (FIG. 3(B) of simultaneously forming contact holes 43 and 45 by etching using the mask 42, and a fifteenth step (FIG. 3(C) of connecting electrodes formed in the contact holes 43 and 45 to bit lines formed by etching a bit line film 34.

As shown in FIG. 1(A), the transfer gates 20 are formed by superposing a gate oxide film 21, a gate polysilicon film 22 and an offset silicon dioxide film 23 in that order on the silicon wafer 10. A resist film of a pattern corresponding to the transfer gates 20 is formed over the offset silicon dioxide film 23 by an ordinary photolithographic process, and the offset silicon dioxide film 23 is patterned by dry etching using the gate polysilicon film 22 as a stopper. The transfer gates 20 are formed by patterning the gate polysilicon film 22 by dry etching using the offset silicon dioxide film 23 as a mask after removing the resist film by ashing. The effect of using the offset silicon dioxide film 23 as a mask is the same as that explained above in connection with the description of the conventional semiconductor device fabricating method.

After the transfer gates 20 have been formed, the n-wells 11 in the peripheral circuit region Rp and the memory cell region Rm are covered with a resist mask, not shown, and the p-wells 12 are doped with an n-type impurity by ion implantation as indicated by the arrows to form n-type diffused layers 15 which serve as the source/drain regions of nMOSFETs.

As illustrated in FIG. 1(B), in the second and the third step, the silicon dioxide film 35, which serves as a protective film, is deposited by a CVD process over the entire surface of the silicon wafer 10. The polysilicon film 36 having a high(polysilicon film)/(first silicon dioxide film 35) etch selectivity is deposited over the first silicon dioxide film 35 by a CVD process. In the fourth step, the polysilicon film 36 is etched by an anisotropic etching process to form the side walls 36a on the side surfaces of the transfer gates 20 as shown in FIG. 1(C) Conditions for this anisotropic etching process are, for example, an ECR plasma etching system operating at a discharge frequency of 2.45 GHz, $Cl_2$ gas supplied at 100 $cm^3$/min into a reaction chamber evacuated at a pressure of 5 mTorr, 300 W microwaves, a RF power density of 0.113 W/cm, and an electrode temperature of 20° C. The duration of the anisotropic etching is determined so that the sum of the thickness of the first silicon dioxide film 35 and that of the side walls 36a is great enough to serve as a mask to be used for forming the diffused layers forming the source/drain regions of the MOSFETs in the peripheral circuit region Rp. The thickness of the first silicon dioxide film 35 is determined so that the first silicon dioxide film 35 remains after the side walls 36a are removed in the sixth step.

In the fifth step, regions excluding the p-well 12 and the n-well 11 of the peripheral circuit region Rp are covered with a mask, not shown, the p-well of the peripheral circuit region Rp is doped with an n-type impurity, and then the n-well 11 of the same is doped with a p-type impurity by ion implantation processes as indicated by the arrows in FIG. 1(C) to form $p^+$-type diffused layers 16 and $n^+$-type diffused layers 17 as the source/drain regions of the MOSFETs in the peripheral circuit region Rp. The side walls 36a determine regions to be subjected to ion implantation, i.e., the positions of the diffused layers 16 and 17 relative to the transfer gates 20. The characteristics of the MOSFETs are dependent on the positional relation between the diffused layers 16 and 17 and the transfer gates 20.

In the sixth step, the side walls 36a formed by etching the polysilicon film 36, which has a sufficiently high (polysilicon film 36)/(first silicon dioxide film 35) etch selectivity, are removed by an isotropic etching process. Conditions for this isotropic etching process are, for example, a microwave down-flow etching system operating at a discharge frequency of 2.45 GHz, CF gas, $O_2$ gas and $Cl_2$ gas supplied at 175 $cm^3$/min, 125 $cm^3$/min and 40 $cm^3$/min, respectively, into a reaction chamber at a pressure of 40 Pa, 270 w microwaves, and an electrode temperature of 25° C.

Referring to FIG. 1(D), in the seventh step, the silicon nitride film 31 is deposited in a thickness sufficient for the silicon nitride film 31 to serve as a stopper in a later etching process for forming contact holes over the entire surface of the silicon wafer 10 by a CVD process so that the silicon nitride film 31 may not block up spaces between the transfer gates in the memory cell region Rm. Although dependent on design rule, the silicon dioxide film 35 is on the order of 20 nm in thickness and the silicon nitride film 31 is on the order of 50 NM in thickness when the intervals between the transfer gates 20 in the memory cell region Rm are, for example, 200 NM.

After the silicon nitride film 31 has been formed, a mask 47 of a pattern covering the memory cell region Rm is formed as shown in FIG. 1(E) by an ordinary photolithographic process in the eighth step. Part of the silicon nitride film 31 formed in the peripheral circuit region Rp is removed by an isotropic etching process of conditions for etching the silicon nitride film 31 at a high (silicon nitride film 31)/(first silicon dioxide film 35) etch selectivity. Conditions for this isotropic etching process are, for example, a microwave down-flow etching system operating at a discharge frequency of 2.45 GHz, CF gas, $O_2$ gas, $N_2$ gas and $Cl_2$ gas supplied at 270 $cm^3$/min, 270 $cm^3$/min, 80 $cm^3$/min and 160 $cm^3$/min, respectively, into a reaction chamber at a pressure of 80 Pa, 600 W microwaves, and an electrode temperature of 25° C. Since the mask 47 formed in the memory cell region Rm in the eighth step need not be formed in a very high accuracy, an i-ray stepper may be used in the photolithographic process.

In the ninth step, the mask 47 is removed by ashing and the second silicon dioxide film 32 is deposited over the entire surface of the silicon wafer 10 so as to cover the transfer gates 20. In the tenth step, the surface of the second silicon dioxide film 32 is flattened as shown in FIG. 1(F) by CMP. The first to the tenth step are included in the wafer processing process.

In the eleventh step, i.e., the first step of the wiring process, a mask 40 of a resist for forming contact holes reaching the silicon wafer 10 in the memory cell region Rm is formed by an ordinary photolithographic process as shown in FIG. 2(A), and the second silicon dioxide film 32 is etched by using the mask 40 and the silicon nitride film 31 as a stopper, and the silicon nitride film 31 is etched to form the contact holes 41. Conditions for an etching process for etching the second silicon dioxide film 32 are, for example, a magnetron etching system, CF gas, Ar gas and CO gas supplied at 16 $cm^3$/min, 400 $cm^3$/min and 300 $cm^3$/min, respectively, into a reaction chamber at a pressure of 40 mTorr, a RF power of 1300 W, an electrode spacing of 27 mm, a cooling He back pressure of 3/70 Torr (center/edge), and an electrode temperature of 27° C. Conditions for an etching process for etching the silicon nitride film 31 are, for example, CHF gas, Ar gas and $O_2$ gas supplied at 20 $cm^3$/min, 100 $cm^3$/min and 20 $cm^3$/min, respectively, into a reaction chamber at a pressure of 50 mTorr, a RF power of 300 W, an electrode spacing of 32 mm, a cooling He back pressure of 3/70 Torr (center/edge) and an electrode temperature of 20° C.

In the twelfth step, the mask 40 is removed by ashing, the contact holes 41 are filled up with doped polysilicon, the doped polysilicon filling up the contact holes 41 is etched back to form the pads 50 as shown in FIG. 2(B). The pads 50 are connected to capacitor electrodes by a later process.

The thirteenth step is executed after the pads 50 have been formed. As shown in FIG. 3(A), a silicon dioxide film 33, namely, an insulating layer, is deposited, and a patterned mask 42 for forming contact holes reaching the silicon wafer 10 in the memory cell region Rm and contact holes reaching the gate polysilicon film 22 of the transfer gates 20 in the peripheral circuit region Rp is formed on the third silicon dioxide film 33 by an ordinary photolithographic process.

In the fourteenth step, the third silicon dioxide film 33 and the second silicon dioxide film 32 are etched by using the patterned mask 42 and using the silicon nitride film 31 as a stopper to form contact holes 43 reaching the silicon wafer 10 and contact holes 45 reaching the gate polysilicon film 22 of the transfer gates 20 simultaneously as shown in FIG. 3(B). Conditions for an etching process for etching the silicon dioxide films 33 and 32 are, for example, a magnetron etching system, CF gas, Ar gas and CO gas supplied at 16 $cm^3$/min, 400 $cm^3$/min and 300 $cm^3$/min, respectively, into a reaction chamber at a pressure of 40 mTorr, a RF power of 1300 W, an electrode spacing of 27 mm, a cooling He back pressure of 3/70 Torr (center/edge) and an electrode temperature of 20° C. Conditions for an etching process for etching the silicon nitride film 31 are, for example, CHF gas, Ar gas and $O_2$ gas are supplied at 20 $cm^3$/min, 100 $cm^3$/min and 20 $cm^3$/min, respectively, into a reaction chamber at a pressure of 40 mTorr, a RF power of 300 W, an electrode spacing of 32 mm, a cooling He back pressure of 3/70 Torr (center/edge) and an electrode temperature of 20° C.

Thus the contact holes 41 and 43 reaching the silicon wafer 10 can be formed by etching the silicon dioxide films 33 and 32 by using the silicon nitride film 31 as a guide without causing insulation breakdown in the transfer gates 20, even if openings of the mask corresponding to the contact holes 41 and 43 are somewhat dislocated from their correct positions. Since (silicon nitride film 31)/(silicon dioxide film) etch selectivity is on the order of 1, the offset silicon dioxide film 23 of the transfer gates 20, and the first silicon dioxide film 35 are etched when the silicon nitride film 31 is etched, so that the contact holes 43 and 45 reaching the gate polysilicon film 22 and the silicon wafer 10 can be formed by the foregoing two-stage etching process.

In the fourteenth step, the mask 42 is removed by ashing, the bit line film 34 for forming bit lines is deposited so as to fill up the contact holes 43 and 45, a patterned mask 46 of a pattern corresponding to that of bit lines is formed on the bit line film 34 by an ordinary photolithographic process, and the bit line film 34 is etched by using the mask 46 and using the third silicon dioxide film 33 as a stopper. After the bit lines have been formed, necessary processes including a capacitor electrode forming process are carried out to accomplish the wafer processing process (preparatory process) for fabricating a DRAM. Subsequently, the workpiece is tested, and the workpiece is subjected to a packaging process (finishing process) to complete a semiconductor device.

The first embodiment deposits the silicon nitride film 31 in a thickness sufficient for the silicon nitride film 31 to serve as a stopper in the etching process for forming the contact holes after removing the side walls 36a formed by etching the polysilicon film so that the silicon nitride film 31 may not block up spaces between the transfer gates 20 in the memory cell region Rm. Accordingly, the spaces between the transfer gates 20 will not be blocked up by the silicon nitride film 31 even if the spaces between the transfer gates 20 are reduced for device miniaturization.

Since the part of the silicon nitride film 31 formed in the peripheral circuit region Rp is removed by the wafer processing process, the contact holes 43 formed in the memory cell region Rm and reaching the silicon wafer 10, and the contact holes 45 formed in the peripheral circuit region Rp and reaching the transfer gates 20 can simultaneously be formed. The semiconductor device fabricating method in the first embodiment needs one photolithographic process less than the conventional semiconductor device fabricating method for forming the contact holes and one photolithographic process more than the conventional semiconductor device fabricating method for removing the silicon nitride film 31. The former is a critical layer and requires high accuracy, whereas the latter is not a critical layer not requiring very high accuracy and can be processed by a low-cost process. Consequently, the total cost of the semiconductor device fabricated by the semiconductor device fabricating method in the first embodiment of the present invention is lower than that of the equivalent semiconductor device fabricated by the conventional semiconductor device fabricating method.

Second Embodiment

FIGS. 4, 5 and 6 illustrate a workpiece in different steps of a semiconductor device fabricating method in a second embodiment according to the present invention. In a semiconductor device fabricated by the semiconductor device fabricating method in the second embodiment, the arrangement of wells 11 and 12 in a silicon wafer 10, isolation regions 13 and 14 and transfer gates 20, and the separation of a peripheral circuit region Rp and a memory cell region Rm are the same as those in the semiconductor device fabricated by the semiconductor device fabricating method in the first embodiment.

Figure 4A:
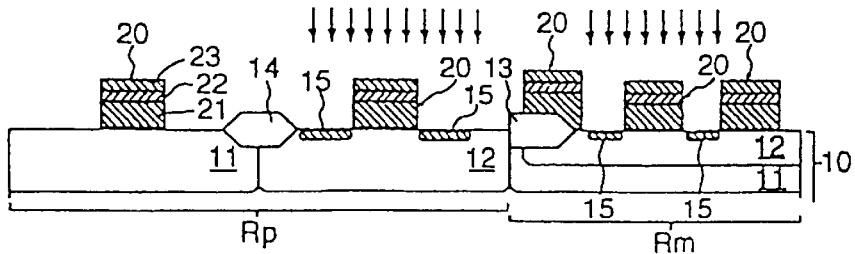
FIGS. 4(A) to 4(F) are enlarged typical sectional views of a workpiece in different steps of a wafer processing process included in a semiconductor device fabricating method in a second embodiment according to the present invention.
Figure 4B:
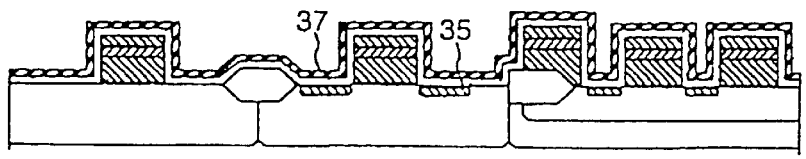
Figure 4C:
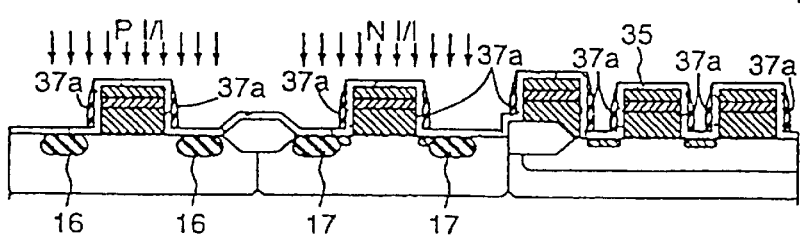
Figure 4D:
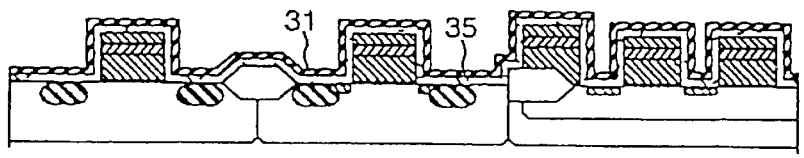
Figure 4E:
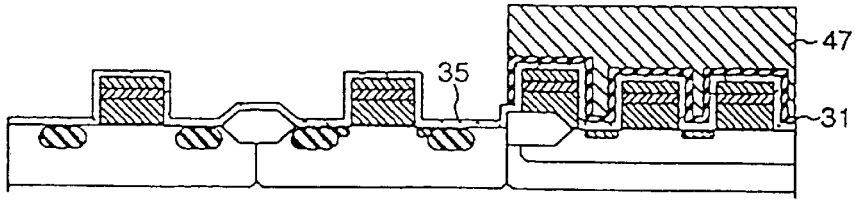
Figure 4F:
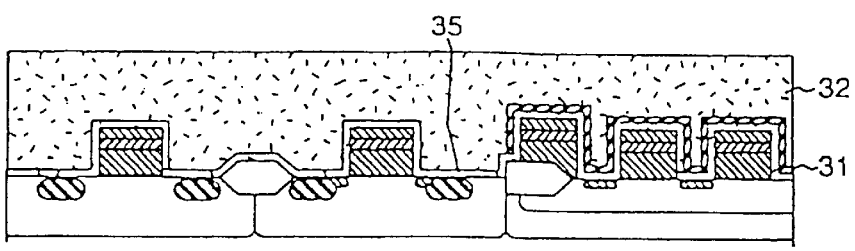
Figure 5A:
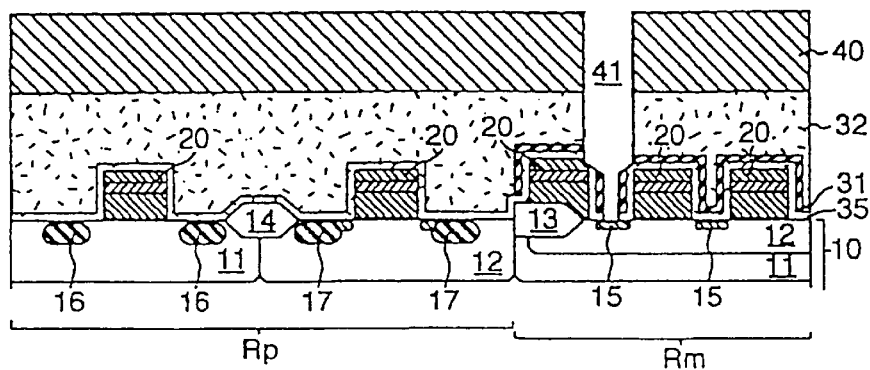
FIGS. 5(A) and 5(B) are enlarged typical sectional views of the workpiece in different steps of a wiring process included in the semiconductor device fabricating method in the second embodiment according to the present invention.
Figure 5B:
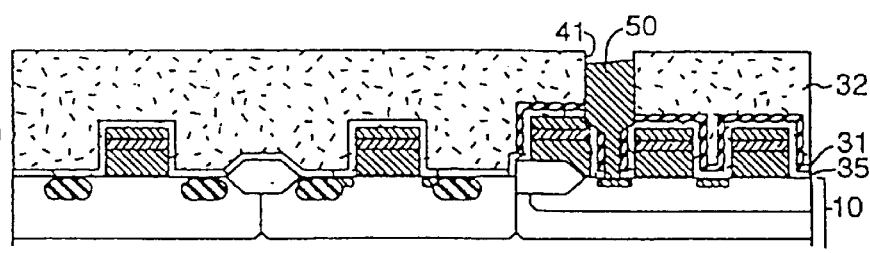
Figure 6A:
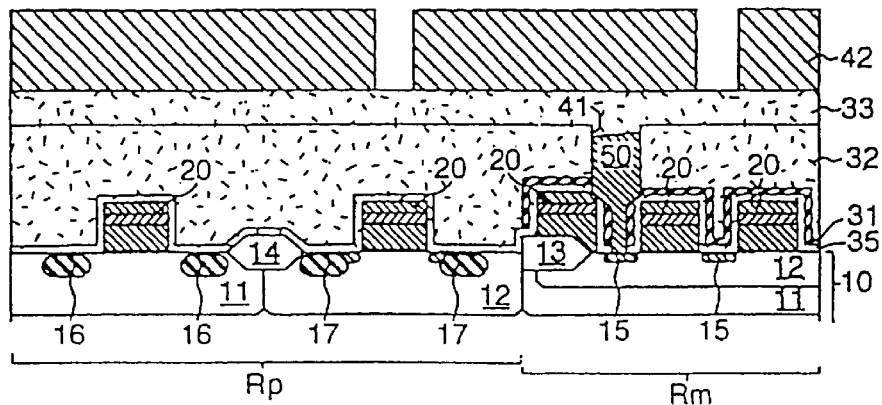
FIGS. 6(A) to 6(C) are enlarged typical sectional views of the workpiece in different steps of the wiring process included in the semiconductor device fabricating method in the second embodiment according to the present invention.
Figure 6B:
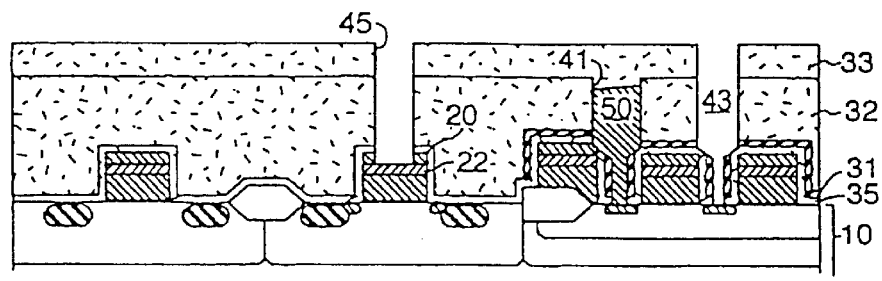
Figure 6C:
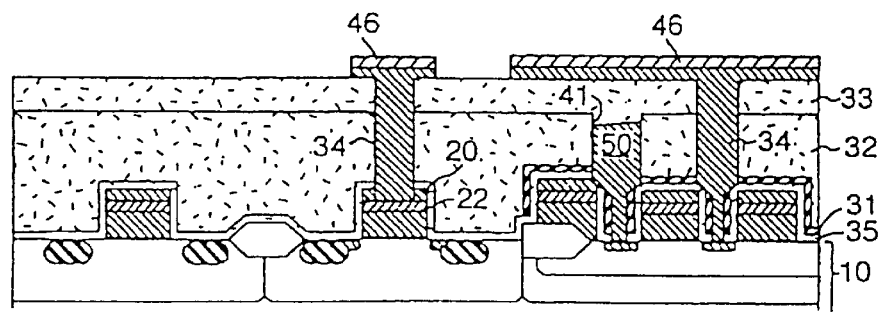

The semiconductor device fabricating method in the second embodiment comprises a first step (FIG. 4(A)) of forming transfer gates 20 on the silicon wafer 10, a second step (FIG. 4(B)) of forming a silicon dioxide film 35 as a protective film, a third step (FIG. 4(B)) of depositing a silicon nitride film 37 as a different kind of film on the first silicon dioxide film 35, a fourth step (FIG. 4(C)) of forming side walls 37a on the side surfaces of the transfer gates 20, a fifth step (FIG. 4(C)) of doping regions around the transfer gates 20 in the peripheral circuit region Rp with an n-type and a p-type impurity, a sixth step (FIGS. 4(C) and 4(D)) of removing the silicon nitride film 37 by using the first silicon dioxide film 35 as a stopper, a seventh step (FIG. 4(D)) of forming a silicon nitride film 31 as a stopper over the entire surface of the silicon wafer 10, an eighth step (FIG. 4(E)) of removing part of the silicon nitride film 31 in the peripheral circuit region Rp, a ninth step (FIG. 4(F)) of depositing a second silicon dioxide film 32 over the entire surface of the silicon wafer 10 so as to cover the transfer gates 20, a tenth step (FIG. 4(F)) of flattening the surface of the second silicon dioxide film 32, an eleventh step (FIG. 5(A)) of forming contact holes 41 for pads 50 to be connected to capacitor electrodes, a twelfth step (FIG. 5(B)) of forming the pads 50 in the contact holes 41, a thirteenth step (FIG. 6(A)) of forming a mask 42 for forming contact holes for pads to be connected to bit lines of a bit line film 34, a fourteenth step (FIG. 6(B) of simultaneously forming contact holes 43 and 45 by etching using the mask 42, and a fifteenth step (FIG. 6(C) of connecting electrodes formed in the contact holes 43 and 45 to bit lines formed by etching the bit line film 34.

The semiconductor device fabricating method in the second embodiment differs from that in the first embodiment in that the silicon nitride film 37 is formed instead of the polysilicon film 36 in the third step, the silicon nitride film 37 is etched in the fourth step to form the side walls 37a, and the silicon nitride film 37 forming the side walls 37a is removed by etching in the sixth step. The first step of the semiconductor device fabricating method in the second embodiment is the same as the corresponding step of the semiconductor device fabricating method in the first embodiment. The second to the sixth step will be described below.

As shown in FIG. 4(B), in the second and the third step, the first silicon dioxide film 35, which serves as a protective film, is deposited over the entire surface of the silicon wafer 10, and the silicon nitride film 37 having a (silicon nitride film 37)/(first silicon dioxide film 35) etch selectivity is deposited on the first silicon dioxide film 35 by a CVD process. In the fourth step, the silicon nitride film 37 is etched by an anisotropic etching process to form the side walls 37a on the side surfaces of the transfer gates 20 as shown in FIG. 4(C). Conditions for the anisotropic etching process for the over etching of the silicon nitride film 37 are, for example, a diode parallel plates reactive ion etching system operating at a discharge frequency of 13.56 MHz, CHF gas and $O_2$ gas supplied at 67 $cm^3$/min and 13 $cm^3$/min, respectively, into a reaction chamber at a pressure of 40 mTorr, a RF power of 350 W, an electrode spacing of 35 mm and an electrode temperature of 40° C. The duration of the anisotropic etching is determined so that the sum of the thickness of the first silicon dioxide film 35 and that of the side walls 37a is great enough to serve as a mask to be used for forming the diffused layers forming the source/drain regions of MOSFETs in the peripheral circuit region Rp. The thickness of the first silicon dioxide film 35 is determined so that the first silicon dioxide film 35 remains after the side walls 37a are removed in the sixth step.

In the fifth step, regions excluding the p-well 12 and the n-well 11 of the peripheral circuit region Rp are covered with a mask formed by an ordinary photolithographic process, the p-well of the peripheral circuit region Rp is doped with an n-type impurity and then the n-well 11 of the same is doped with a p-type impurity by ion implantation processes as indicated by the arrows in FIG. 4(C) to form $p^+$-type diffused layers 16 and $n^+$-type diffused layers 17 as the source/drain regions of the MOSFETs in the peripheral circuit region Rp. The side walls 37a determine regions to be subjected to ion implantation, i.e., the positions of the diffused layers 16 and 17 relative to the transfer gates 20. The characteristics of the MOSFETs are dependent on the positional relation between the diffused layers 16 and 17 and the transfer gates 20.

In the sixth step, the side walls 37a formed by etching the silicon nitride film 36, which has a sufficiently high (silicon nitride film 37)/(first silicon dioxide film 35) etch selectivity, are removed by an isotropic etching process. Conditions for this isotropic etching process are, for example, a microwave down-flow etching system operating at a discharge frequency of 2.45 GHz, CF gas, $O_2$ gas, $N_2$ gas and $Cl_2$ gas supplied at 270 $cm^3$/min, 270 $cm^3$/min, 80 $cm^3$/min and 170 $cm^3$/min, respectively, into a reaction chamber at a pressure of 80 Pa, 600 W microwaves, and an electrode temperature of 25° C.

In the seventh step, the silicon nitride film 31 is deposited in a thickness sufficient for the silicon nitride film 31 to serve as a stopper in a later etching process for forming contact holes over the entire surface of the silicon wafer 10 by a CVD process so that the silicon nitride film 31 may not block up regions between the transfer gates 20 in the memory cell region Rm. The seventh step of the second embodiment is the same as that of the first embodiment and hence the further description thereof will be omitted.

Since the silicon nitride film 31 as a stopper is deposited in a thickness which will not block up the spaces between the transfer gates 20 in the memory cell region Rm after removing the side walls 37a, the spaces will not be blocked up by the silicon nitride film 31 even if the intervals between the transfer gates 20 are reduced for device miniaturization.

Since the second embodiment, similarly to the first embodiment, forms simultaneously the contact holes 43 reaching the silicon wafer 10 in the memory cell region Rm and the contact holes 45 reaching the transfer gates 20 in the peripheral circuit region Rp, the second embodiment is able to reduce the total cost of the semiconductor device.

Third Embodiment

FIGS. 7, 8 and 9 illustrate a workpiece in different steps of a semiconductor device fabricating method in a third embodiment according to the present invention. In a semiconductor device fabricated by the semiconductor device fabricating method in the third embodiment, the arrangement of wells 11 and 12 in a silicon wafer 10, isolation regions 13 and 14 and transfer gates 20, and the separation of a peripheral circuit region Rp and a memory cell region Rm are the same as those in the semiconductor device fabricated by the semiconductor device fabricating method in the first embodiment.

Figure 7A:
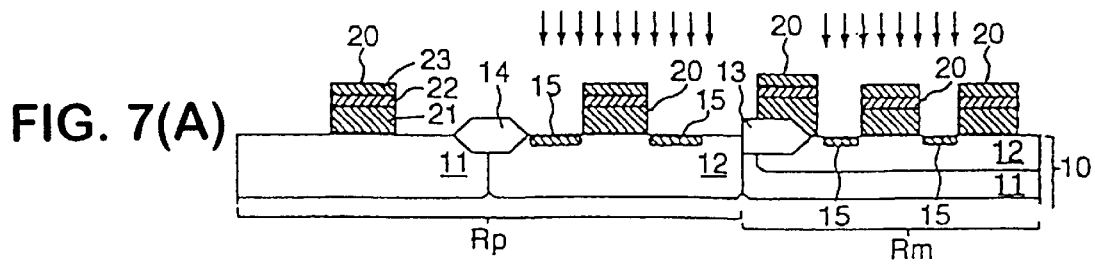
FIGS. 7(A) to 7(F) are enlarged typical sectional views of a workpiece in different steps of a wafer processing process included in a semiconductor device fabricating method in a third embodiment according to the present invention.
Figure 7B:
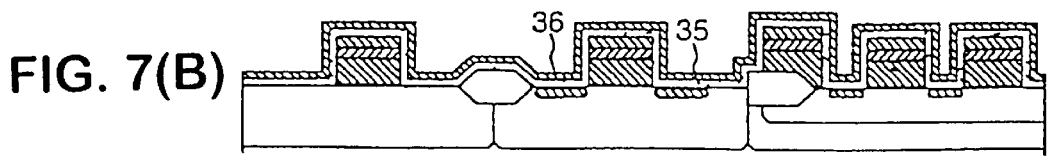
Figure 7C:
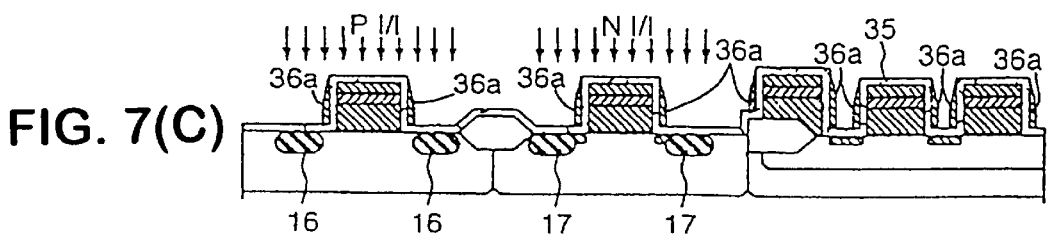
Figure 7D:
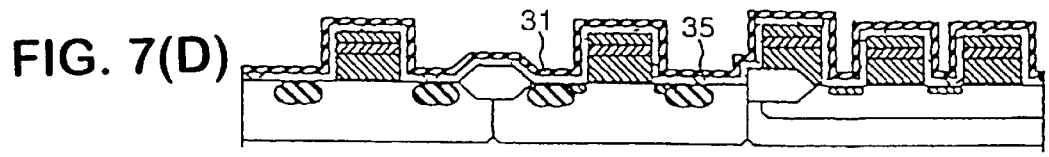
Figure 7E:
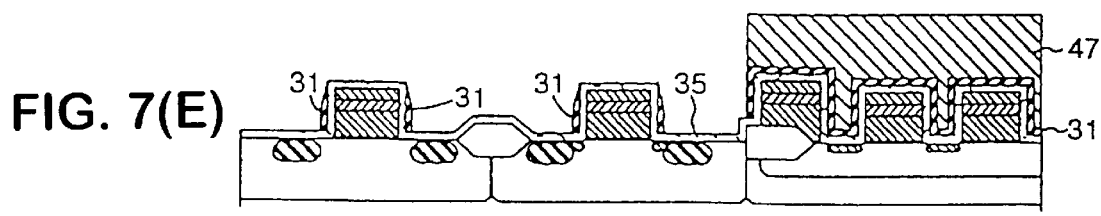
Figure 7F:
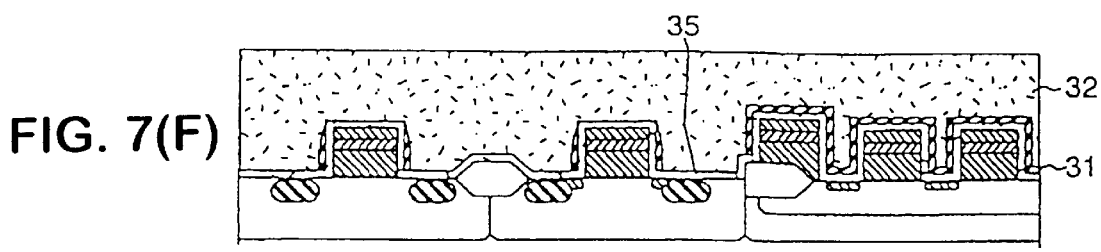
Figure 8A:
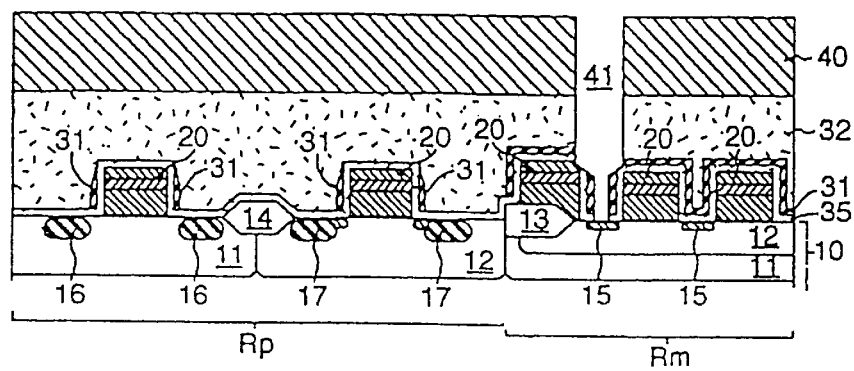
FIGS. 8(A) and 8(B) are enlarged typical sectional views of the workpiece in different steps of a wiring process included in the semiconductor device fabricating method in the third embodiment according to the present invention.
Figure 8B:
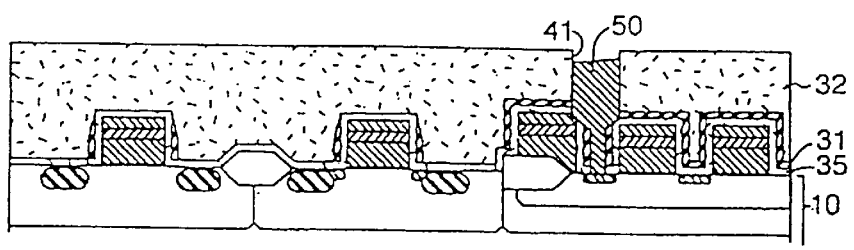
Figure 9A:
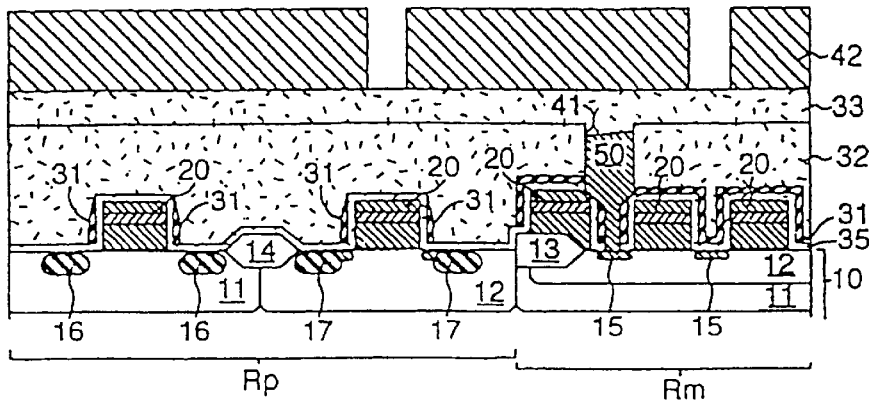
FIGS. 9(A) to 9(C) are enlarged typical sectional views of the workpiece in different steps of the wiring process included in the semiconductor device fabricating method in the third embodiment according to the present invention.
Figure 9B:
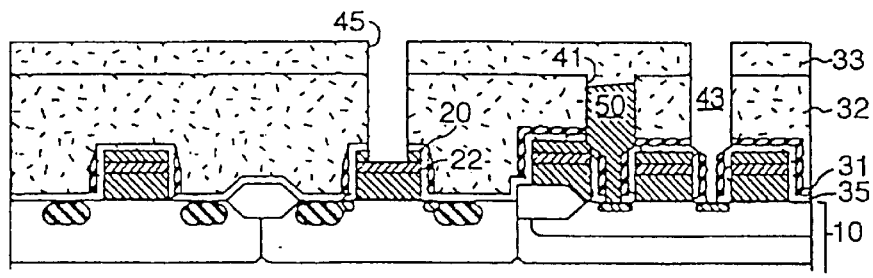
Figure 9C:
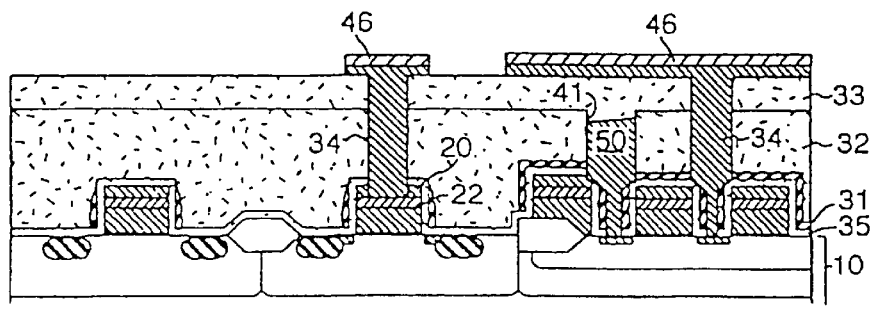

The semiconductor device fabricating method in the third embodiment comprises a first step (FIG. 7(A)) of forming transfer gates 20 on the silicon wafer 10, a second step (FIG. 7(B)) of forming a silicon dioxide film 35 as a protective film, a third step of depositing a polysilicon film 36 as a different kind of film on the first silicon dioxide film 35, a fourth step (FIG. 7(C)) of forming side walls 36a on the side surfaces of the transfer gates 20, a fifth step (FIG. 7(C)) of doping regions around the transfer gates 20 in the peripheral circuit region Rp with an n-type and a p-type impurity, a sixth step (FIGS. 7(C) and 7(D)) of removing the polysilicon film 36 by using the first silicon dioxide film 35 as a stopper, a seventh step (FIG. 7(D)) of forming a silicon nitride film 31 as a stopper over the entire surface of the silicon wafer 10, an eighth step (FIG. 7(E)) of removing part of the silicon nitride film 31 in the peripheral circuit region Rp excluding parts of the silicon nitride film 31 on the side surfaces of the transfer gates, a ninth step (FIG. 7(F)) of depositing a second silicon dioxide film 32 over the entire surface of the silicon wafer 10 so as to cover the transfer gates 20, a tenth step (FIG. 7(F)) of flattening the surface of the second silicon dioxide film 32, an eleventh step (FIG. 8(A)) of forming contact holes 41 for pads to be connected to capacitor electrodes, a twelfth step (FIG. 8(B)) of forming the pads 50 in the contact holes 41, a thirteenth step (FIG. 9(A)) of forming a mask 42 for forming contact holes for pads to be connected to bit lines of a bit line film 34, a fourteenth step (FIG. 9(B) of simultaneously forming contact holes 43 and 45 by etching using the mask 42, and a fifteenth step (FIG. 9(C) of connecting electrodes formed in the contact holes 43 and 45 to bit lines formed by etching the bit line film 34.

The semiconductor device fabricating method in the third embodiment removes part of the silicon nitride film 31 in the peripheral circuit region Rp excluding parts of the silicon nitride film 31 on the side surfaces of the transfer gates in the eighth step, whereas the first embodiment removes the part of the silicon nitride film 31 in the peripheral circuit region Rp entirely in the eighth step. Since the first to the seventh step of the third embodiment are the same as the corresponding steps of the first embodiment, the eighth step of the third embodiment will be described below.

As shown in FIG. 7(E), in the eighth step, a mask 47 covering the memory cell region Rm is formed by an ordinary photolithographic process, and part of the silicon nitride film 31 having a sufficiently high (silicon nitride film 31)/(first silicon dioxide film 35) etch selectivity in the peripheral circuit region Rp is removed by an anisotropic etching process leaving parts of the silicon nitride film 31 covering the side surfaces of the transfer gates 20. Conditions for this anisotropic etching process for etching the silicon nitride film 31 are, for example, a reactive ion etching system operating at a discharge frequency of 400 kHz, CF gas and Ar gas supplied at 80 cm$^3$/min and 800 cm$^3$/min, respectively, into a reaction chamber at a pressure of 300 mTorr, a RF power of 400 W, an electrode spacing of 12 mm and an electrode temperature of 0° C.

In the ninth step, the second silicon dioxide film 32 is deposited over the entire surface of the silicon wafer 10 so as to cover the transfer gates 20 after removing the mask 47 by ashing. In the tenth step, the surface of the second silicon dioxide film 32 is polished by CMP to flatten the same as shown in FIG. 7(F). In the peripheral circuit region Rp, the second silicon dioxide film 32 is formed over the parts of the silicon nitride film 31 covering the side surfaces of the transfer gates 20. The eleventh step and the following steps are the same as those of the first embodiment and hence the description thereof will be omitted.

The third embodiment has effects, in addition to the effects of the first embodiment of enabling device miniaturization and simultaneous formation of the contact holes, of enabling the formation of the contact holes reaching the silicon wafer 10 in the peripheral circuit region Rp close to the transfer gates 20 without causing the insulation breakdown of the transfer gates 20 because the parts of the silicon nitride film 31 remaining on the side surfaces of the transfer gates 20 serve as stoppers and therefore, the device can be miniaturized.

Fourth Embodiment

FIGS. 10, 11 and 12 illustrate a workpiece in different steps of a semiconductor device fabricating method in a fourth embodiment according to the present invention. In a semiconductor device fabricated by the semiconductor device fabricating method in the fourth embodiment, the arrangement of wells 11 and 12 in a silicon wafer 10, isolation regions 13 and 14 and transfer gates 20, and the separation of a peripheral circuit region Rp and a memory cell region Rm are the same as those in the semiconductor device fabricated by the semiconductor device fabricating method in the first embodiment.

Figure 10A:
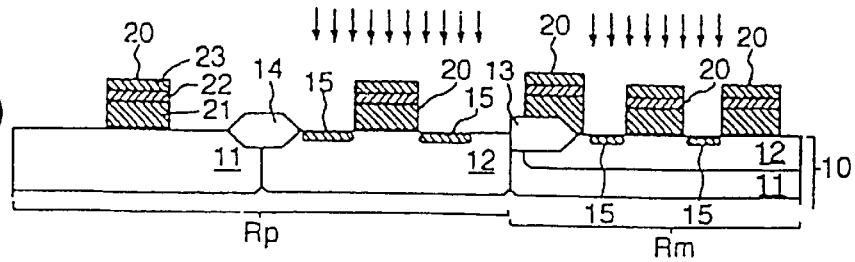
FIGS. 10(A) to 10(F) are enlarged typical sectional views of a workpiece in different steps of a wafer processing process included in a semiconductor device fabricating method in a fourth embodiment according to the present invention.
Figure 10B:
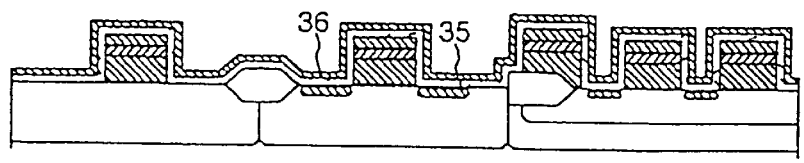
Figure 10C:
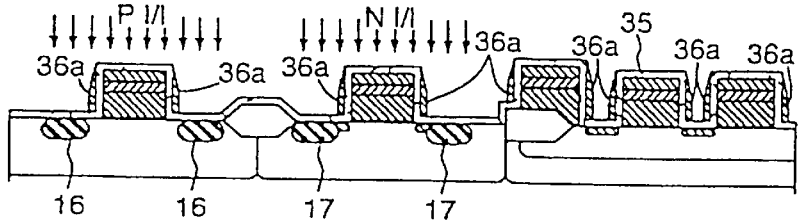
Figure 10D:
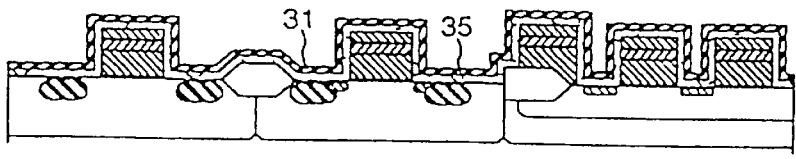
Figure 10E:
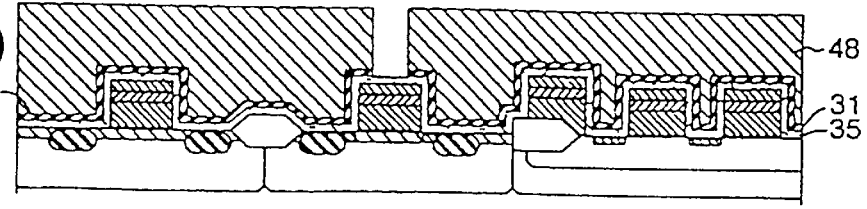
Figure 10F:
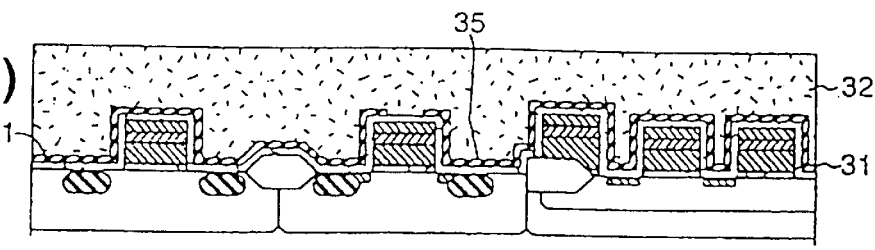
Figure 11A:
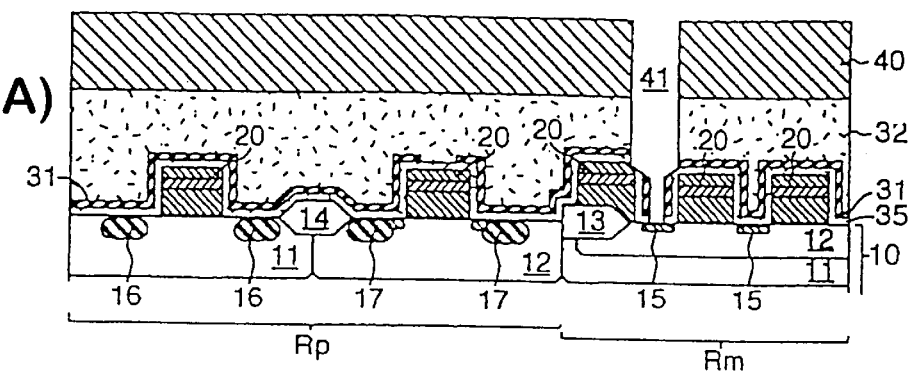
FIGS. 11(A) and 11(B) are enlarged typical sectional views of the workpiece in different steps of a wiring process included in the semiconductor device fabricating method in the fourth embodiment according to the present invention.
Figure 11B:
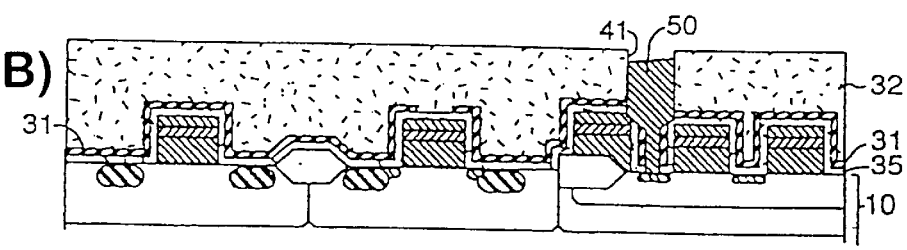
Figure 12A:
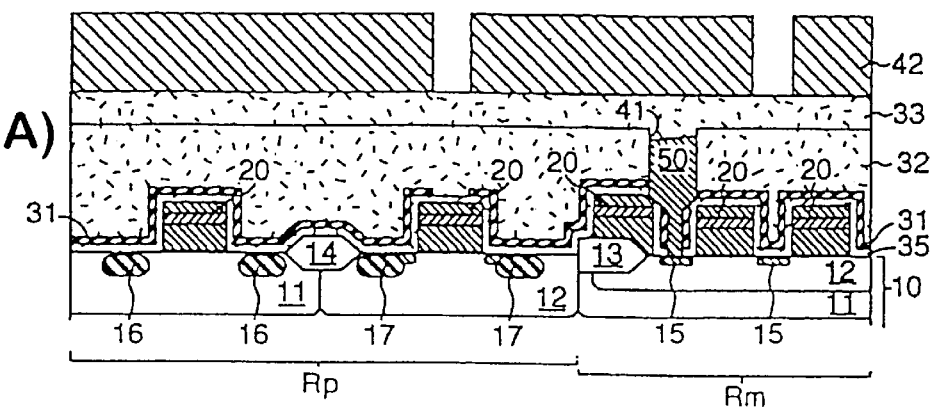
FIGS. 12(A) to 12(C) are enlarged typical sectional views of the workpiece in different steps of the wiring process included in the semiconductor device fabricating method in the fourth embodiment according to the present invention.
Figure 12B:
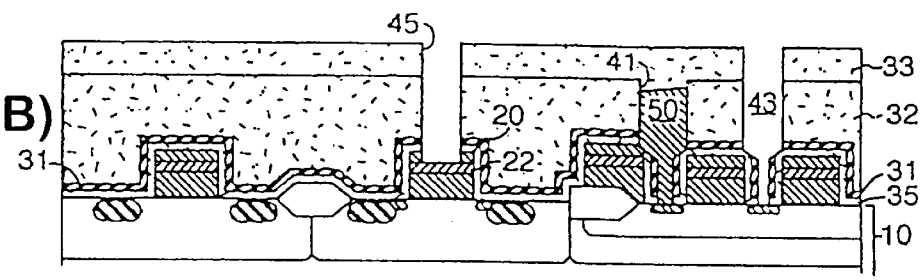
Figure 12C:
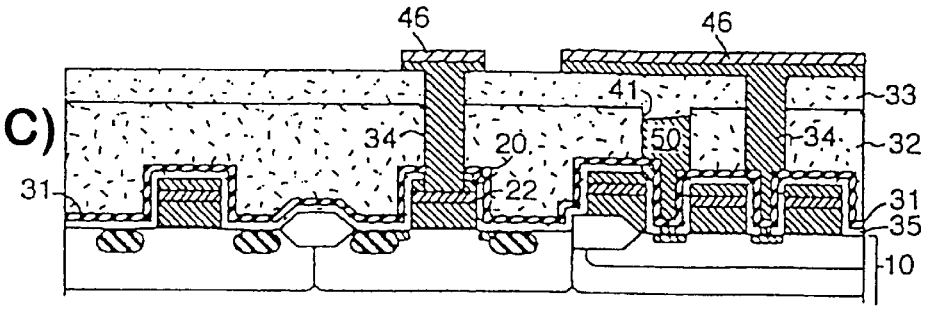

The semiconductor device fabricating method in the fourth embodiment comprises a first step (FIG. 10(A)) of forming transfer gates 20 on the silicon wafer 10, a second step (FIG. 10(B)) of forming a silicon dioxide film 35 as a protective film, a third step (FIG. 10(B)) of depositing a polysilicon film 36 as a different kind of film on the first silicon dioxide film 35, a fourth step (FIG. 10(C)) of forming side walls 36a on the side surfaces of the transfer gates 20, a fifth step (FIG. 10(C)) of doping regions around the transfer gates 20 in the peripheral circuit region Rp with an n-type and a p-type impurity, a sixth step (FIGS. 10(C) and 10(D)) of removing the polysilicon film 36 by using the first silicon dioxide film 35 as a stopper, a seventh step (FIG. 10(D)) of forming a silicon nitride film 31 as a stopper over the entire surface of the silicon wafer 10, an eighth step (FIG. 10(E)) of removing parts of the silicon nitride film 31 on only the upper surfaces of the transfer gates 20 in the peripheral circuit region Rp to be connected to bit lines of a bit line film 34, a ninth step (FIG. 10(F)) of depositing a second silicon dioxide film 32 over the entire surface of the silicon wafer 10 so as to cover the transfer gates 20, a tenth step (FIG. 10(F)) of flattening the surface of the second silicon dioxide film 32, an eleventh step (FIG. 11(A)) of forming contact holes 41 for pads to be connected to capacitor electrodes, a twelfth step (FIG. 11(B)) of forming the pads 50 in the contact holes 41, a thirteenth step (FIG. 12(A)) of forming a mask 42 for forming contact holes for pads to be connected to the bit lines of the bit line film 34, a fourteenth step (FIG. 12(B) of simultaneously forming contact holes 43 and 45 by etching using the mask 42, and a fifteenth step (FIG. 12(C) of connecting electrodes formed in the contact holes 43 and 45 to the bit lines formed by etching the bit line film 34.

The semiconductor device fabricating method in the fourth embodiment removes parts of the silicon nitride film 31 on only the upper surfaces of the transfer gates 20 in the peripheral circuit region Rp to be connected to the bit lines of the bit line film 34, whereas the first embodiment removes the part of the silicon nitride film 31 in the peripheral circuit region Rp entirely in the eighth step. Since the first to the seventh step of the fourth embodiment are the same as the corresponding steps of the first embodiment, the eighth step of the fourth embodiment will be described below.

As shown in FIG. 10(E), in the eighth step, a mask 48 having openings corresponding to the upper surfaces of the transfer gates 20 to be connected to the bit lines of the bit line film 34, and covering the peripheral circuit region Rp excluding the surfaces of the transfer gates 20 to be connected to the bit lines of the bit line film 34 and the memory cell region Rm is formed by an ordinary photolithographic process, and parts of the silicon nitride film 31 having a sufficiently high (silicon nitride film 31)/(first silicon dioxide film 35) etch selectivity corresponding to the upper surfaces of the transfer gates 20 to be connected to the bit lines of the bit line film 34 in the peripheral circuit region Rp are removed by an etching process. Conditions for this etching process are, for example, a parallel plates reactive ion etching process system operating at a discharge frequency of 13.4 GHz, CHF gas and $O_2$ gas supplied at 67 cm$^3$/min and 13 cm$^3$/min, respectively, into a reaction chamber at a pressure of 40 mTorr, a RF power of 350 W, an electrode spacing of 35 mm and an electrode temperature of 40° C. These etching conditions etch the silicon nitride film 31 in a tapered shape; etching conditions may be determined for isotropic or anisotropic etching.

In the ninth step, the second silicon dioxide film 32 is deposited over the entire surface of the silicon wafer 10 so as to cover the transfer gates 20 after removing the mask 48 by ashing. In the tenth step, the surface of the second silicon dioxide film 32 is polished by CMP to flatten the same as shown in FIG. 10(F). In the peripheral circuit region Rp, the second silicon dioxide film 32 is formed over the parts of the silicon nitride film 31 covering the side surfaces of the transfer gates 20. The eleventh step and the following steps are the same as those of the first embodiment and hence the description thereof will be omitted.

The fourth embodiment has effects, in addition to the effects of the first embodiment of enabling device miniaturization and simultaneous formation of the contact holes, of enabling the formation of the contact holes reaching the silicon wafer 10 in the peripheral circuit region Rp close to the transfer gates 20 without causing the insulation breakdown of the transfer gates 20 because the parts of the silicon nitride film 31 remaining on the side surfaces of the transfer gates 20 serve as stoppers and therefore, the device can be miniaturized.

Fifth Embodiment

FIGS. 13, 14 and 15 illustrate a workpiece in different steps of a semiconductor device fabricating method in a fifth embodiment according to the present invention. In a semiconductor device fabricated by the semiconductor device fabricating method in the fifth embodiment, the arrangement of wells 11 and 12 in a silicon wafer 10, isolation regions 13 and 14 and transfer gates 20, and the separation of a peripheral circuit region Rp and a memory cell region Rm are the same as those in the semiconductor device fabricated by the semiconductor device fabricating method in the first embodiment.

Figure 13A:
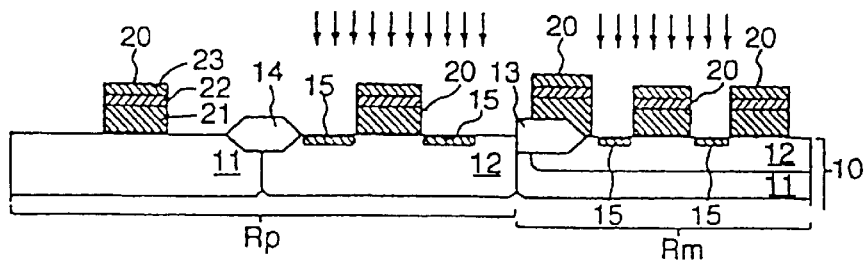
FIGS. 13(A) to 13(F) are enlarged typical sectional views of a workpiece in different steps of a wafer processing process included in a semiconductor device fabricating method in a fifth embodiment according to the present invention.
Figure 13B:
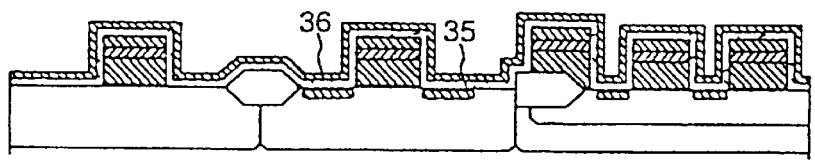
Figure 13C:
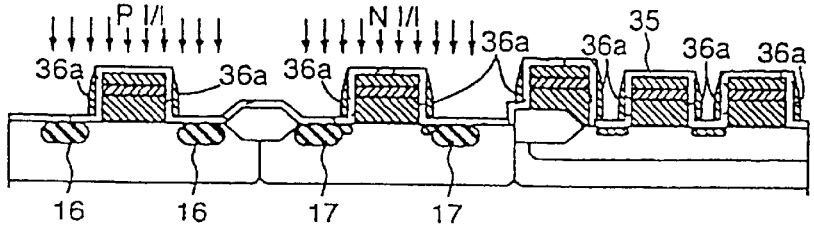
Figure 13D:
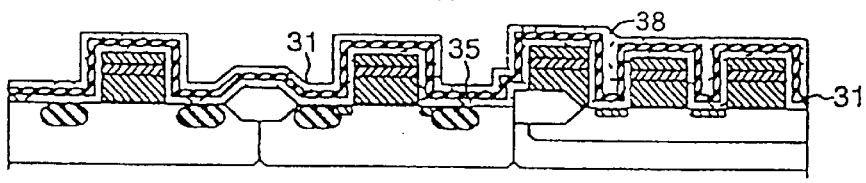
Figure 13E:
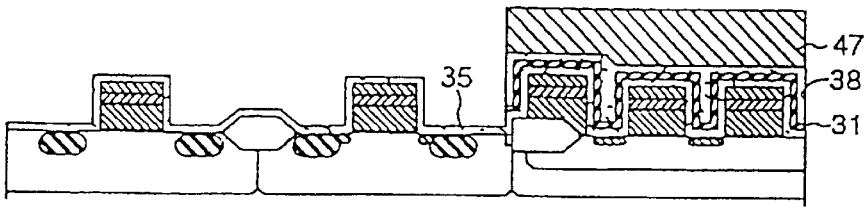
Figure 13F:
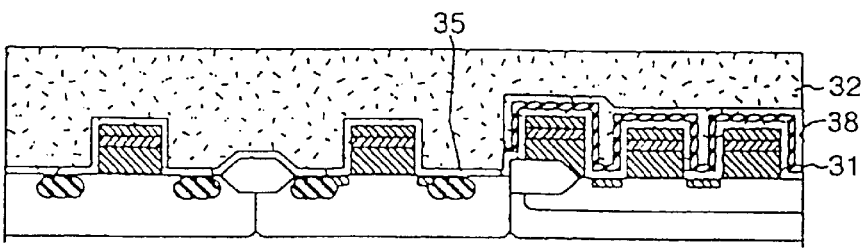
Figure 14A:
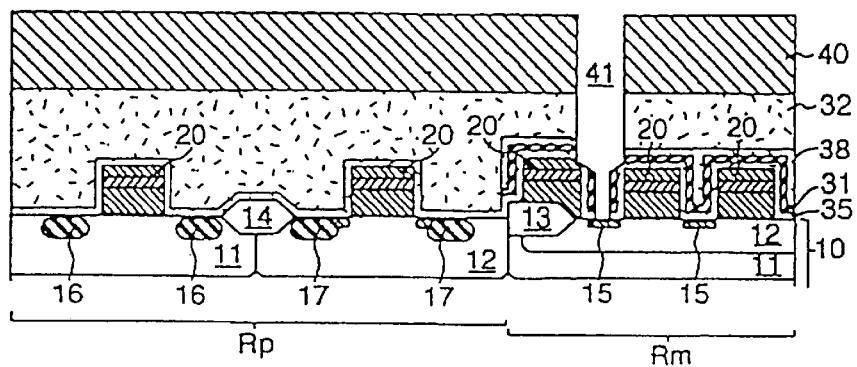
FIGS. 14(A) and 14(B) are enlarged typical sectional views of the workpiece in different steps of a wiring process included in the semiconductor device fabricating method in the fifth embodiment according to the present invention.
Figure 14B:
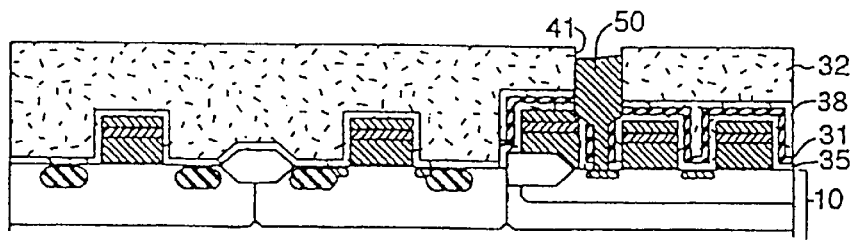
Figure 15A:
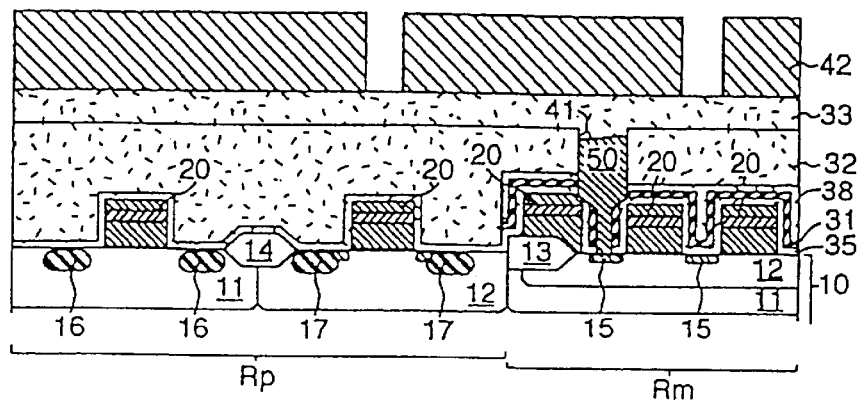
FIGS. 15(A) to 15(C) are enlarged typical sectional views of the workpiece in different steps of the wiring process included in the semiconductor device fabricating method in the fifth embodiment according to the present invention.
Figure 15B:
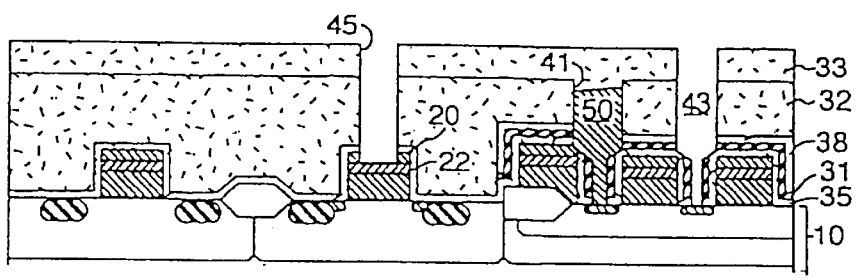
Figure 15C:
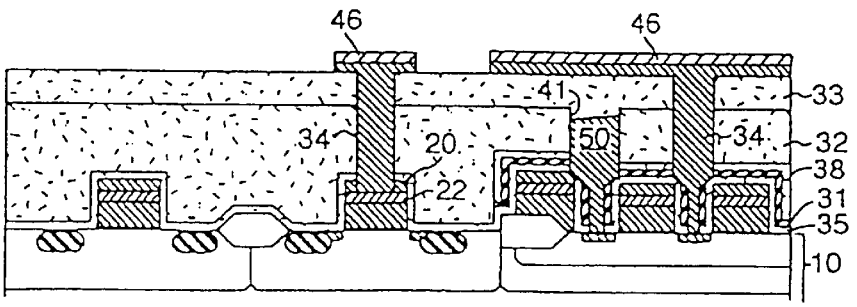
Figure 16A:
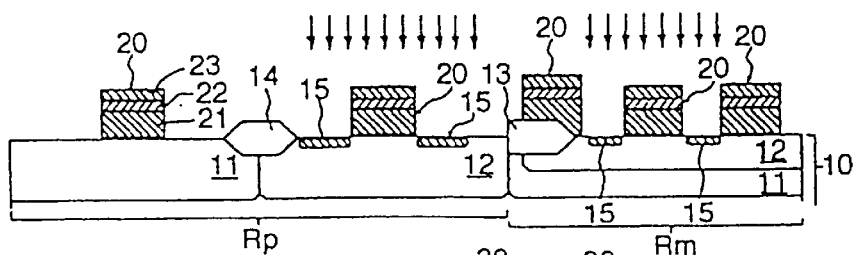
FIGS. 16(A) to 16(D) are enlarged typical sectional views of a wafer in different steps of a wafer processing process included in a conventional semiconductor device fabricating method.
Figure 16B:
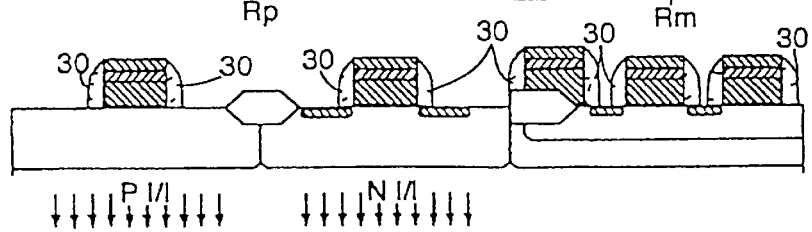
Figure 16C:
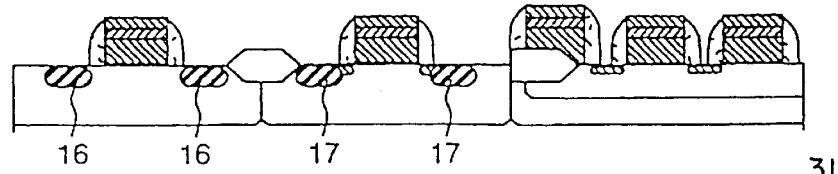
Figure 16D:
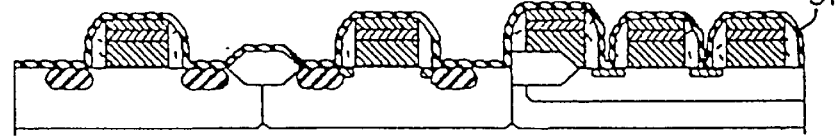
Figure 17A:
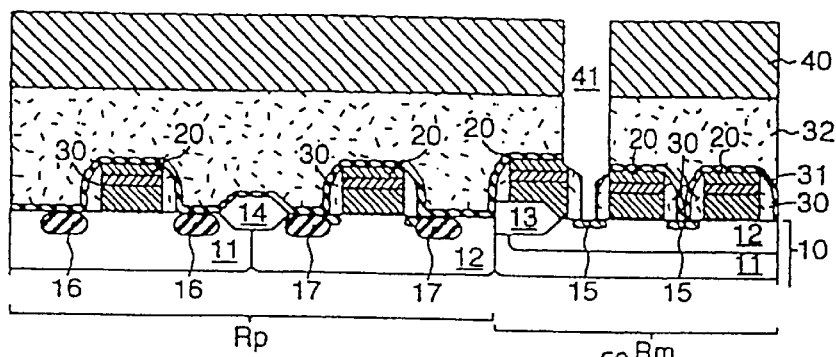
FIGS. 17(A) and 17(B) are enlarged typical sectional views of the wafer in different steps of a wiring process included in the conventional semiconductor device fabricating method.
Figure 17B:
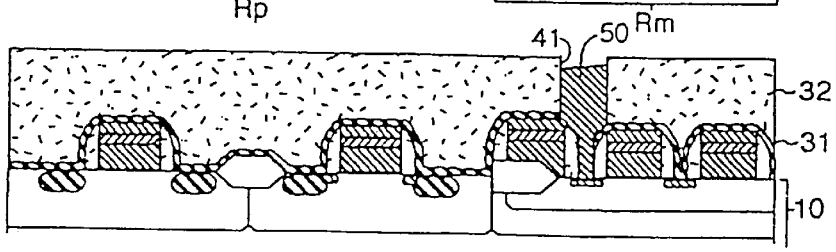
Figure 18A:
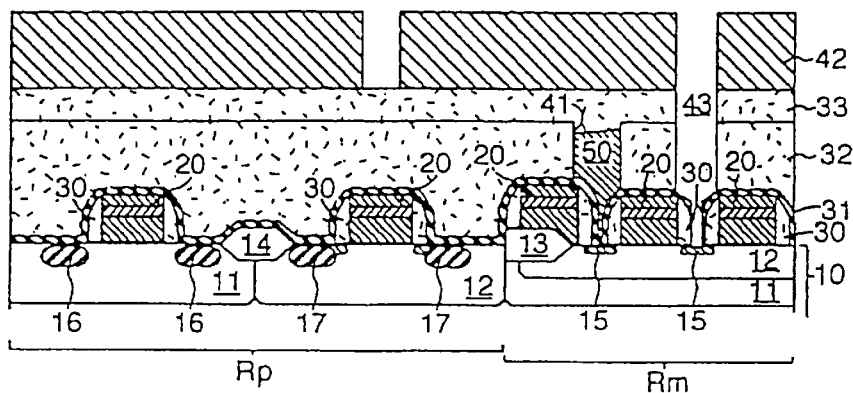
FIGS. 18(A) to 18(C) are enlarged typical sectional views of the wafer in different steps of the wiring process included in the conventional semiconductor device fabricating method.
Figure 18B:
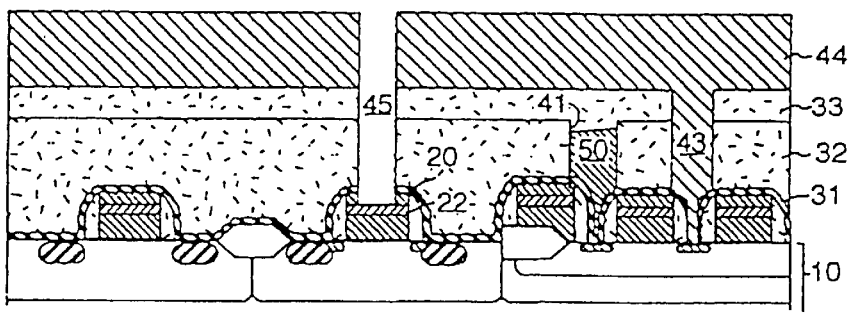
Figure 18C:
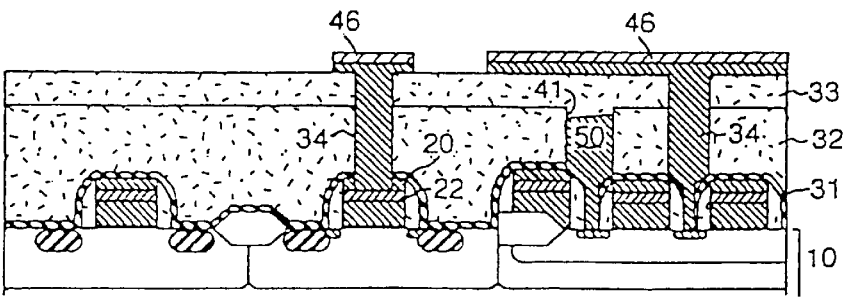

The semiconductor device fabricating method in the fifth embodiment comprises a first step (FIG. 13(A)) of forming transfer gates 20 on the silicon wafer 10, a second step (FIG. 13(B)) of forming a first silicon dioxide film 35 as a protective film, a third step (FIG. 13(B)) of depositing a polysilicon film 36 as a different kind of film on the first silicon dioxide film 35, a fourth step (FIG. 13(C)) of forming side walls 36a on the side surfaces of the transfer gates 20, a fifth step (FIG. 13(C)) of doping regions around the transfer gates 20 in the peripheral circuit region Rp with an n-type and a p-type impurity, a sixth step (FIGS. 13(C) and 13(D)) of removing the polysilicon film 36 by using the first silicon dioxide film 35 as a stopper, a seventh step (FIG. 13(D)) of forming a silicon nitride film 31 as a stopper over the entire surface of the silicon wafer 10, an eighth step (FIG. 13(D)) of forming a silicon dioxide film 38 for forming a mask on the silicon nitride film 31, a ninth step (FIG. 13(E)) of removing part of the silicon dioxide film 38 in the peripheral circuit region Rp, a tenth step (FIG. 13(F)) removing the silicon nitride film 31 by using the silicon dioxide film 38 as a mask, an eleventh step (FIG. 13(F)) of depositing a second silicon dioxide film 32 over the entire surface of the silicon wafer 10 so as to cover the transfer gates 20, a twelfth step (FIG. 13(F)) of flattening the surface of the second silicon dioxide film 32, a thirteenth step (FIG. 14(A)) of forming contact holes 41 for pads to be connected to capacitor electrodes, a fourteenth step (FIG. 14(B)) of forming the pads 50 in the contact holes 41, a fifteenth step (FIG. 15(A)) of forming a mask 42 for forming contact holes for pads to be connected to bit lines of a bit line film 34, a sixteenth step (FIG. 15(B) of simultaneously forming contact holes 43 and 45 by etching using the mask 42, and a seventeenth step (FIG. 15(C) of connecting electrodes formed in the contact holes 43 and 45 to the bit lines formed by etching the bit line film 34.

The semiconductor device fabricating method in the fifth embodiment includes the eighth step of forming the silicon dioxide film 38 for forming a mask on the silicon nitride film 31 and the ninth step of removing part of the silicon dioxide film 38 in the peripheral circuit region Rp in addition to the steps of the semiconductor device fabricating method in the first embodiment. A mask formed by processing the silicon dioxide film 38 is used in the tenth step, which corresponds to the eighth step of the first embodiment, for etching. Since the first to the seventh step of the fourth embodiment are the same as the corresponding steps of the first embodiment, the eighth to the tenth step of the fifth embodiment will be described below.

As shown in FIG. 13(D), in the eighth step, the silicon dioxide film 38 for forming a mask is formed by a CVD process on the silicon nitride film 31 formed in the seventh step. In the ninth step, a mask 47 of a pattern covering the memory cell region Rm is formed by an ordinary photolithographic process, and part of the silicon dioxide film 38 on the peripheral circuit region Rp is removed by etching using a buffer hydrogen fluoride solution. In the tenth step, the silicon nitride film 31 in the peripheral circuit region Rp is removed by etching using a hot phosphorus acid solution and a part of the silicon dioxide film 38 remains in the memory cell region Rm as a mask after removing the mask 47 by ashing. The eleventh to the seventeenth step are the same as the ninth to the fifteenth step of the first embodiment and hence the description thereof will be omitted.

Since a photoresist has a low resistance against the hot phosphorus acid solution for removing the silicon nitride film 31, the mask 47 cannot directly be formed on the silicon nitride film 31 for etching. Therefore, a mask is formed by patterning the silicon dioxide film 38 resistant to the hot phosphorus acid solution to etch the silicon nitride film 31 through the same mask.

The fifth embodiment has effects, in addition to the effects of the first embodiment of enabling device miniaturization and simultaneous formation of the contact holes, of enabling simultaneously processing a plurality of wafers in a batch processing mode because a wet etching process can be used for removing the silicon nitride film 31 and thereby the semiconductor device fabricating method in the fifth embodiment can be accomplished in a shorter time than those in the other embodiments. Although the semiconductor device fabricating method in the fifth embodiment has more steps than those in the other embodiments using a dry etching process, the semiconductor device fabricating method in the fifth embodiment needs less time for completing one semiconductor device because the same is able to process a plurality of workpieces simultaneously in a batch processing mode.

As is apparent from the foregoing description, according to the present invention, the side walls formed on the side surfaces of the transfer gates in the low-density region as masks in doping regions around the transfer gates in the low-density region with impurities are removed to secure a relatively wide regions for the silicon nitride film between the transfer gates in the high-density region to avoid blocking up the regions between the transfer gates in the high-density region with the silicon nitride film even if the same regions are reduced due to device miniaturization. Accordingly, the semiconductor device fabricating method of the present invention is more effective for the further device miniaturization than the conventional semiconductor device fabricating method which leaves the side walls unremoved until the last process.

When the silicon dioxide film is deposited after the part of the silicon nitride film as a stopper formed in the low-density region has been removed, the contact holes for interconnecting the bit lines and the silicon wafer and those for interconnecting the bit lines and the transfer gates can simultaneously be formed by etching the silicon nitride film after etching the silicon dioxide film by using the silicon nitride film as a stopper.

What is claimed is:

1. A semiconductor device fabricating method for fabricating a semiconductor device having a high-density region in which transistors are arranged with a relatively high density, and a low-density region in which transistors are arranged with a relatively low density, the semiconductor device fabricating method sequentially comprising:

forming transfer gates on a silicon wafer;

forming a first silicon dioxide film as a protective film over an entire surface of the silicon wafer;

depositing a second film on the protective film, the second film being different in kind from that of the protective film and having a high (second film)/(protective film) etch selectivity;

forming side walls on the side surfaces of the transfer gates by anisotropic etching of the second film;

doping regions around the transfer gates in the low-density region with impurities, using the side walls as a mask;

removing the side walls by etching using the protective film as a stopper;

forming a silicon nitride film of a thickness great enough to serve as a stopper over the entire surface of the silicon wafer so that regions between the transfer gates in the high density region may not be blocked up;

removing parts of the silicon nitride film corresponding to at least upper surfaces of the transfer gates to be connected to wiring lines in an upper layer;

depositing a second silicon dioxide film over the entire surface of the silicon wafer, the second silicon dioxide film having a thickness so as to cover the transfer gates;

forming a mask for formation of contact holes in the low-density region that open to the upper surfaces of the transfer gates which are to be connected to wiring lines and for formation of contact holes in the high-density region that open to an upper surface of the silicon wafer which is to be connected to wiring lines by a photolithographic process; and forming the contact holes by etching the second silicon dioxide film through the mask by using the silicon nitride film as a stopper and by removing the silicon nitride film by etching.

2. The semiconductor device fabricating method according to claim 1, wherein the second film is a polysilicon.

3. The semiconductor device fabricating method according to claim 1, wherein the second film is a silicon nitride film.

4. The semiconductor device fabricating method according to claim 1, wherein said removing of parts of the silicon nitride film comprises masking the high-density region, the silicon nitride film being etched by isotropic etching to entirely remove the silicon nitride film formed in the low-density region.

5. The semiconductor device fabricating method according to claim 1, wherein said removing of parts of the silicon nitride film comprises masking the high-density regions the silicon nitride film being etched by anisotropic etching to remove the silicon nitride film in the low-density region such that parts of the silicon nitride film covering the side surfaces of the transfer gates remain.

6. The semiconductor device fabricating method according to claim 1, wherein said removing of parts of the silicon nitride film comprises removing only parts of the silicon nitride film corresponding to the upper surfaces of the transfer gates to be connected to the wiring lines.

7. The semiconductor device fabricating method according to claim 1, further comprising:

forming a third silicon dioxide film as a mask for covering the silicon nitride film, after said forming of the silicon nitride film that is used as a stopper, said removing of parts of the silicon nitride film comprises masking the high-density region, etching the third silicon dioxide film with a hydrogen fluoride solution, and entirely removing a part of the silicon nitride film in the low-density region by masking the high-density region using the third silicon dioxide film remaining in the high density film as a mask and then etching the silicon nitride film with a hot phosphoric acid solution.

8. The semiconductor device fabricating method according to claim 1, wherein the transfer gates comprise a polysilicon film and a silicon dioxide film formed on the polysilicon film.

9. A semiconductor device fabrication method comprising:

forming transfer gates in a first region of a substrate and in a second region of the substrate;

forming a first silicon dioxide film on the transfer gates and the substrate;

depositing a second film on the first silicon dioxide film, the second film having a greater etch selectivity than the first silicon dioxide film;

anisotropically etching the second film so that the second film remains only on side surfaces of the transfer gates as side wall spacers;

doping only regions of the substrate around the transfer gates in the first region using the side wall spacers as a mask;

etching the second film using the first silicon dioxide film as an etch stop, to remove the side wall spacers;

forming a silicon nitride film over the first silicon dioxide film;

removing the silicon nitride film at least over upper surfaces of the transfer gates in the first region;

depositing a second silicon dioxide film over the silicon nitride film and on areas of the first silicon dioxide film where the silicon nitride film has been removed; and etching the first and second silicon dioxide films and the silicon nitride film to simultaneously form contact holes through to the upper surfaces of the transfer gates in the first region and through to an upper surface of the substrate between the transfer gates in the second region.

10. The semiconductor device fabrication method of claim 9, wherein said etching to form the contact holes is a two stage process comprising etching the second silicon dioxide film in the first and second regions during a first etching process and etching the silicon nitride film and the first silicon dioxide film during a second etching process.

11. The semiconductor device fabrication method of claim 10, wherein the silicon nitride film is used as an etch stop in the second region during the first etching process.

12. The semiconductor device fabrication method of claim 9, wherein the transfer gates are transistor gates, the first region having a relatively low density of transistors and the second region having a relatively high density of transistors.

13. The semiconductor device fabrication method of claim 9, wherein the second film is a silicon nitride film.

14. The semiconductor device fabrication method of claim 9, wherein the second film is a polysilicon film.

* * * * *